United States Patent
Wang

(10) Patent No.: US 10,251,290 B2
(45) Date of Patent: Apr. 2, 2019

(54) PROTECTIVE CASE ASSEMBLY FOR HANDHELD DEVICE

(71) Applicant: EVOLUTIVE LABS CO., LTD., Taichung (TW)

(72) Inventor: Ching-Fu Wang, Taichung (TW)

(73) Assignee: EVOLUTIVE LABS CO., LTD., Taichung (TW)

( * ) Notice: Subject to any disclaimer, the term of this patent is extended or adjusted under 35 U.S.C. 154(b) by 0 days.

(21) Appl. No.: 15/896,723

(22) Filed: Feb. 14, 2018

(65) Prior Publication Data

US 2019/0069420 A1    Feb. 28, 2019

(30) Foreign Application Priority Data

Aug. 23, 2017   (TW) .............................. 106128631 A

(51) Int. Cl.
    *H04B 1/3888*    (2015.01)
    *H05K 5/02*      (2006.01)
    *H05K 5/03*      (2006.01)
    *H04M 1/02*      (2006.01)
    *A45C 11/00*     (2006.01)

(52) U.S. Cl.
    CPC ............ *H05K 5/0217* (2013.01); *A45C 11/00* (2013.01); *H04B 1/3888* (2013.01); *H04M 1/0283* (2013.01); *H05K 5/03* (2013.01); *A45C 2011/002* (2013.01); *G06F 2200/1633* (2013.01)

(58) Field of Classification Search
    CPC ............................... H04B 1/3888; H04M 1/02
    See application file for complete search history.

(56) References Cited

U.S. PATENT DOCUMENTS

| | | | |
|---|---|---|---|
| 9,451,814 B2 * | 9/2016 | Wilkey | H04B 1/3888 |
| 9,521,889 B2 * | 12/2016 | Fathollahi | A45C 13/002 |
| 9,668,555 B2 * | 6/2017 | Poon | A45C 11/00 |
| 9,831,905 B1 * | 11/2017 | Flores | H04B 1/3888 |
| 2011/0228458 A1 * | 9/2011 | Richardson | H04M 1/0252 361/679.01 |
| 2012/0314354 A1 * | 12/2012 | Rayner | H01H 13/06 361/679.01 |
| 2016/0211877 A1 * | 7/2016 | Poon | H04B 1/3888 |
| 2017/0220068 A1 * | 8/2017 | Youlios | G06F 1/1628 |

* cited by examiner

*Primary Examiner* — Blane J Jackson
(74) *Attorney, Agent, or Firm* — WPAT, P.C., Intellectual Property Attorneys; Anthony King

(57) ABSTRACT

A protective case assembly includes a detachable component having a component outer peripheral surface, a casing body having at least one casing body protrusion, and a coupling unit detachably coupling the detachable component to the casing body and including at least one first protrusion extending outwardly from the component outer peripheral surface, at least one second protrusion extending outwardly from one of the at least one first protrusion and the component outer peripheral surface and cooperating with the at least one first protrusion to define therebetween an engaging groove for engaging with the at least one casing body protrusion, and at least one main groove formed in the casing body for receiving the at least one second protrusion.

17 Claims, 26 Drawing Sheets

PROTECTIVE CASE ASSEMBLY FOR HANDHELD DEVICE

CROSS-REFERENCE TO RELATED APPLICATION

This application claims priority of Taiwanese Patent Application No. 106128631, filed on Aug. 23, 2017.

FIELD

The disclosure relates to a protective case assembly, more particularly to a protective case assembly for a handheld device.

BACKGROUND

Referring to FIGS. 1 to 3, a coupling unit 11 of a conventional protective case assembly 1 is shown to include an annular protrusion 14 extending outwardly from a peripheral edge of a back plate 12 of the protective case assembly 1, and an annular groove 15 formed in an inner peripheral surface of a casing body 13 of the protective case assembly 1 for receiving the annular protrusion 14. When the annular protrusion 14 is received in the annular groove 15, the back plate 12 and the casing body 13 of the protective case assembly 1 can cover three sides of a handheld device (not shown).

However, the coupling unit 11 of the conventional protective case assembly 1 uses a back side of the handheld device to push the back plate 12 so as to abut the annular protrusion 14 against a wall defining the annular groove 15. Thus, if the handheld device located in the protective case assembly 1 is slightly moved in a direction away from the back plate 12, the annular protrusion 14 can easily slide out of the annular groove 15, so that the back plate 12 is likely to detach and fall away from the casing body 13.

SUMMARY

Therefore, an object of the present disclosure is to provide a protective case assembly that is capable of overcoming the aforesaid drawback of the prior art.

Accordingly, a protective case assembly for a handheld device comprises a detachable component having a component outer peripheral edge surface, a casing body having a casing body rear peripheral edge surface formed with at least one casing body protrusion, and a coupling unit detachably coupling the detachable component to the casing body. The coupling unit includes at least one first protrusion extending outwardly from the component outer peripheral edge surface, at least one second protrusion extending outwardly from one of the at least one first protrusion and the component outer peripheral edge surface, and at least one main groove formed in the casing body for receiving the at least one second protrusion. The at least one second protrusion cooperates with the at least one first protrusion to define therebetween an engaging groove for engaging with the at least one casing body protrusion.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
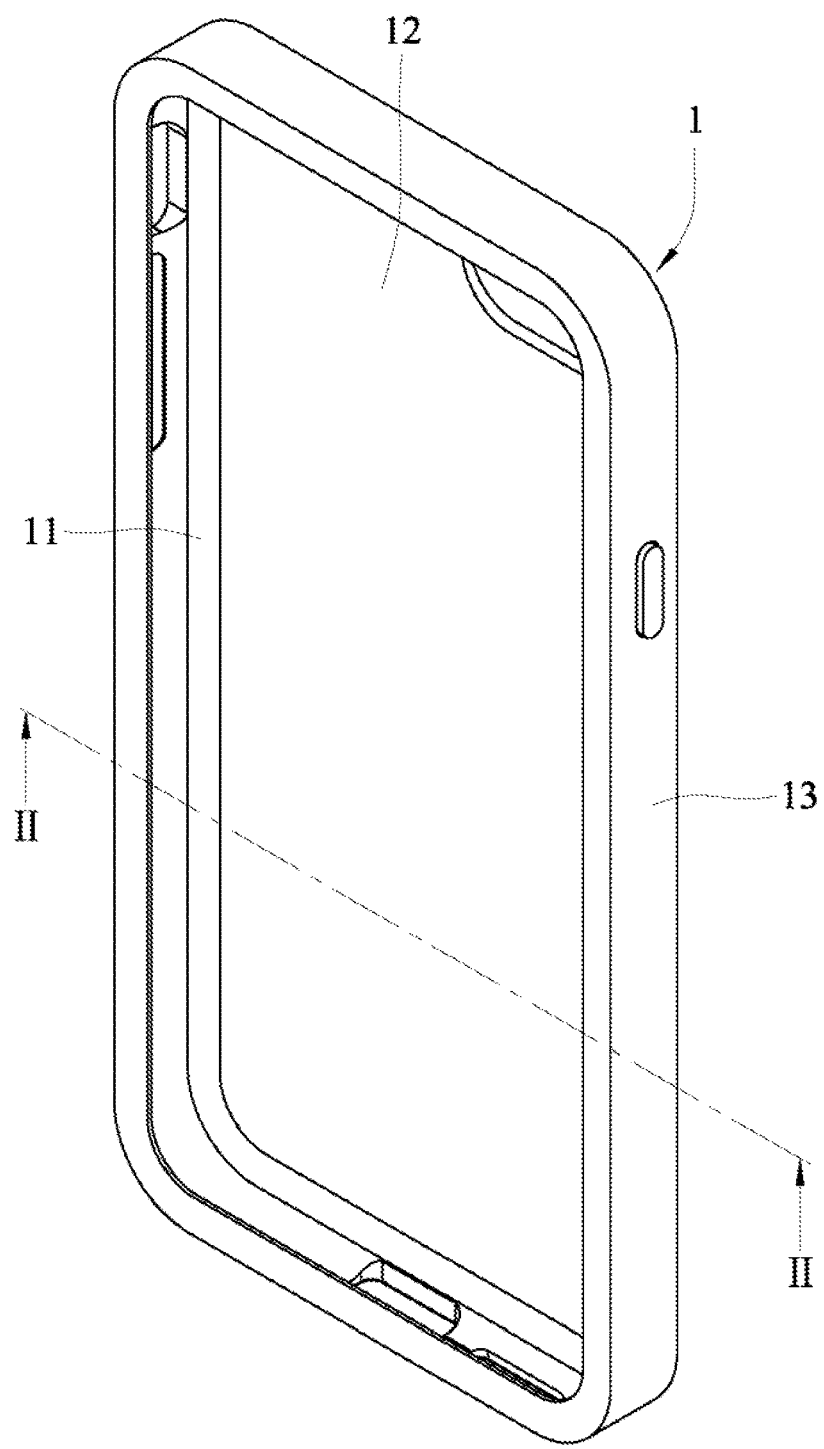
FIG. 1 is a perspective view of a conventional protective case assembly.

Before the present disclosure is described in greater detail with reference to the accompanying embodiments, it should be noted herein that like elements are denoted by the same reference numerals throughout the disclosure.

Referring to FIGS. 4 to 7, a protective case assembly 2 for a handheld device (not shown) according to the first embodiment of the present disclosure includes a detachable component 22, a casing body 23 and a coupling unit 21.

In this embodiment, the detachable component 22 is a back plate, but is not limited thereto. The detachable component 22 has a first surface 221, a second surface 222 opposite to the first surface 221, and a component outer peripheral surface 223 interconnecting the first and second surfaces 221, 222. The component outer peripheral surface 223 has a first outer peripheral surface portion 224 connected to the first surface 221, and a second outer peripheral surface portion 225 connected to the second surface 222 and the first outer peripheral surface portion 224.

The casing body 23 has an outer peripheral surface 231, an inner peripheral surface 232 opposite to the outer peripheral surface 231, and a casing body rear peripheral edge surface 233 interconnecting the outer and inner peripheral surfaces 231, 232. In this embodiment, the casing body 23 is a rectangular frame, but is not limited thereto.

The coupling unit 21 detachably couples the detachable component 22 to the casing body 23, and includes a single first protrusion 211, a single second protrusion 212 and a single main groove 213. The first protrusion 211 is annular, and extends outwardly from the first outer peripheral surface portion 224 of the component outer peripheral surface 223.

The second protrusion 212 is annular, and extends outwardly from the second outer peripheral surface portion 225 of the component outer peripheral surface 223 toward the casing body 23. The first and second protrusions 211, 212 cooperate with each other to define therebetween an engaging groove 214.

In this embodiment, the main groove 213 is annular, and is formed in the inner peripheral surface 232 of the casing body 23, but is not limited thereto. The main groove 213 may also be formed in the casing body rear peripheral edge surface 233. The casing body rear peripheral edge surface 233 is formed with a casing body protrusion 215 that is annular, that is immediately adjacent to the main groove 213, and that is engageable with the engaging groove 214.

After the detachable component 22 and the casing body 23 are assembled, the second protrusion 212 is received in the main groove 213, the casing body protrusion 215 is engaged with the engaging groove 214, and the first protrusion 211 abuts against the casing body rear peripheral edge surface 233. Through this, the detachable component 22 can be detachably coupled to the casing body 23.

It is worth to mention herein that, after the detachable component 22 is coupled to the casing body 23, the first surface 221 of the detachable component 22 is flush with the outer peripheral surface 231 of the casing body 23, and the second surface 222 of the detachable component 22 is flush with the inner peripheral surface 232 of the casing body 23, so that an overall appearance of the protective case assembly 2 presents an effect of a single integral case.

Figure 8:
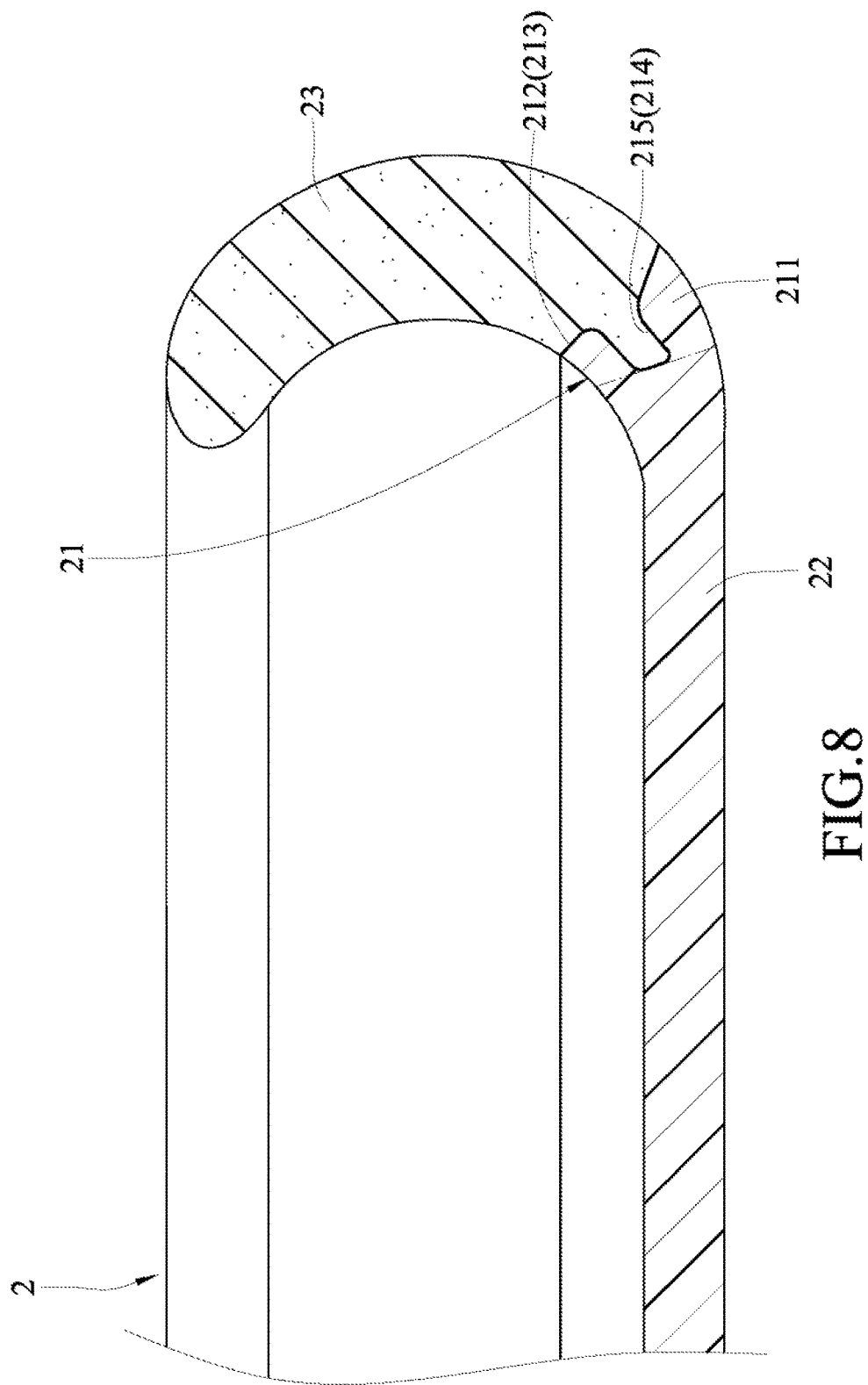
FIG. 8 is a view similar to FIG. 7, but illustrating an alternative form of the first embodiment.

FIG. 8 illustrates an alternative form of the coupling unit 21 of the first embodiment.

Figure 2:
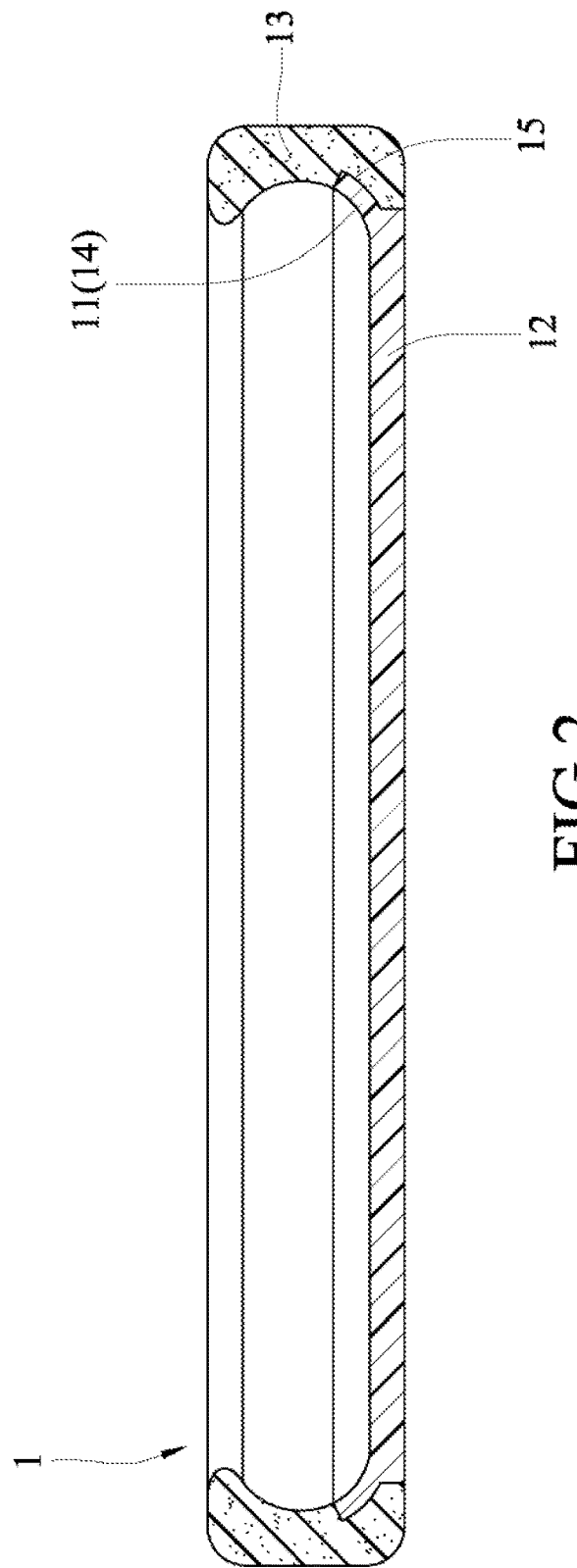
FIG. 2 is a sectional view taken along line II-II of FIG. 1.
Figure 3:
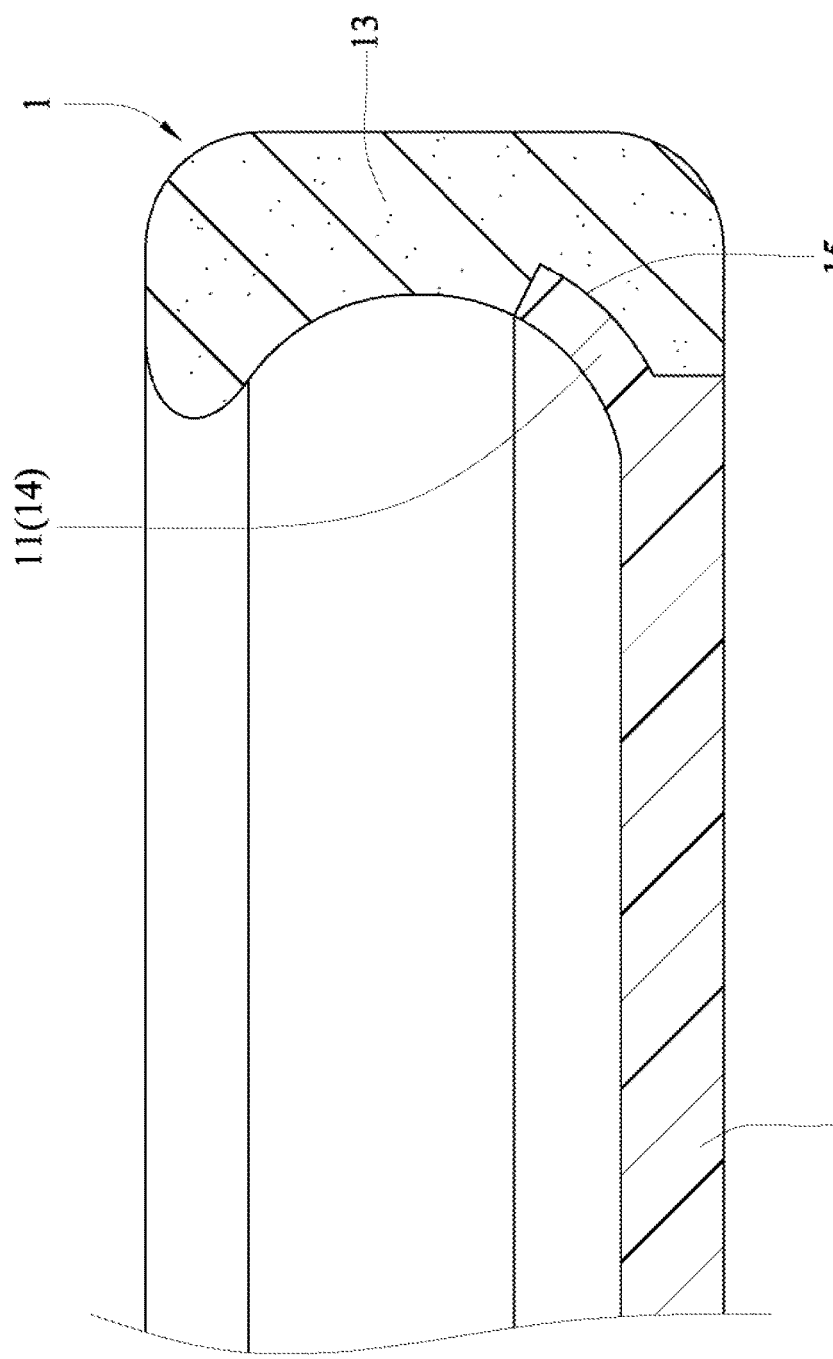
FIG. 3 is an enlarged fragmentary sectional view of FIG. 2.
Figure 4:
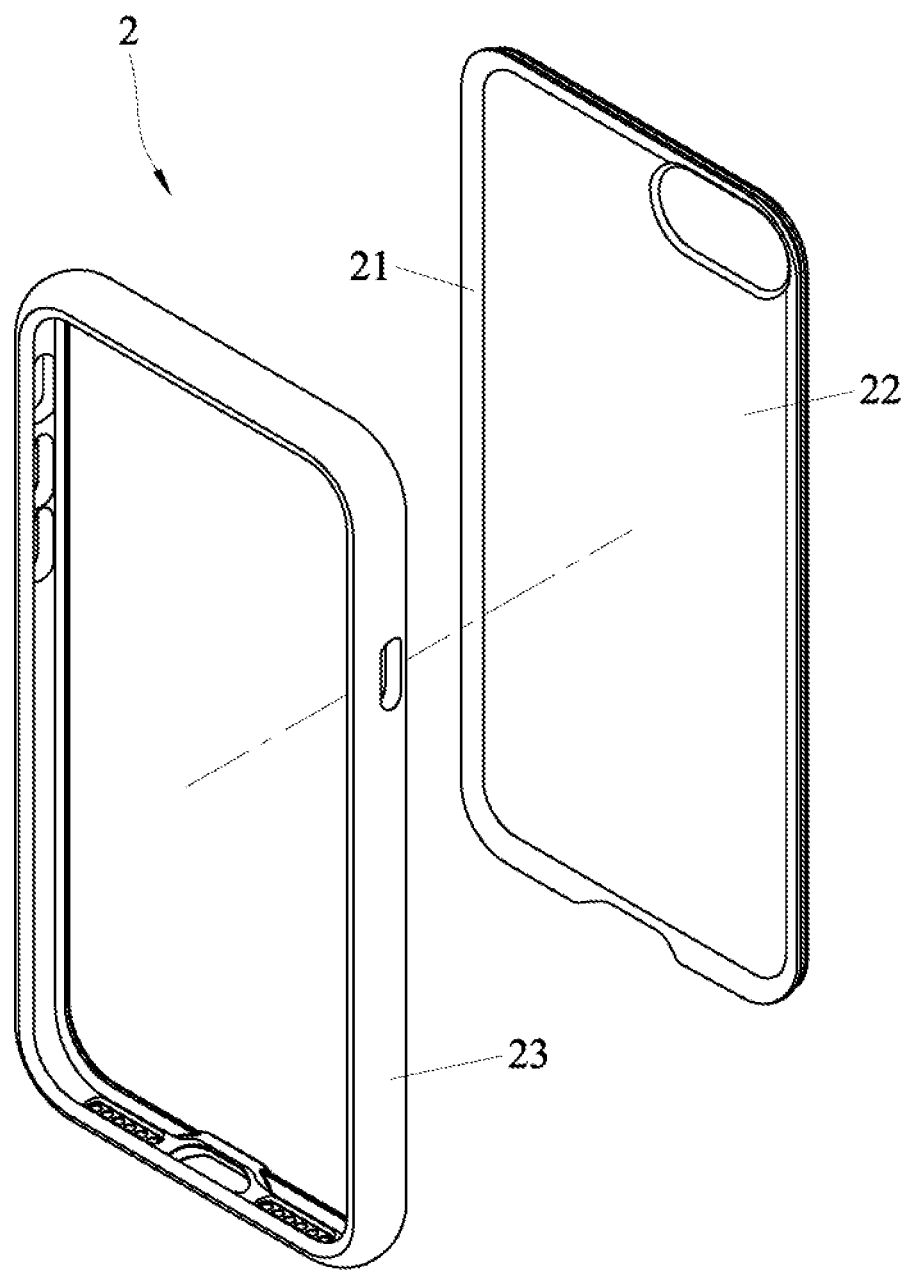
FIG. 4 is an exploded perspective view of a protective case assembly according to the first embodiment of this disclosure.
Figure 5:
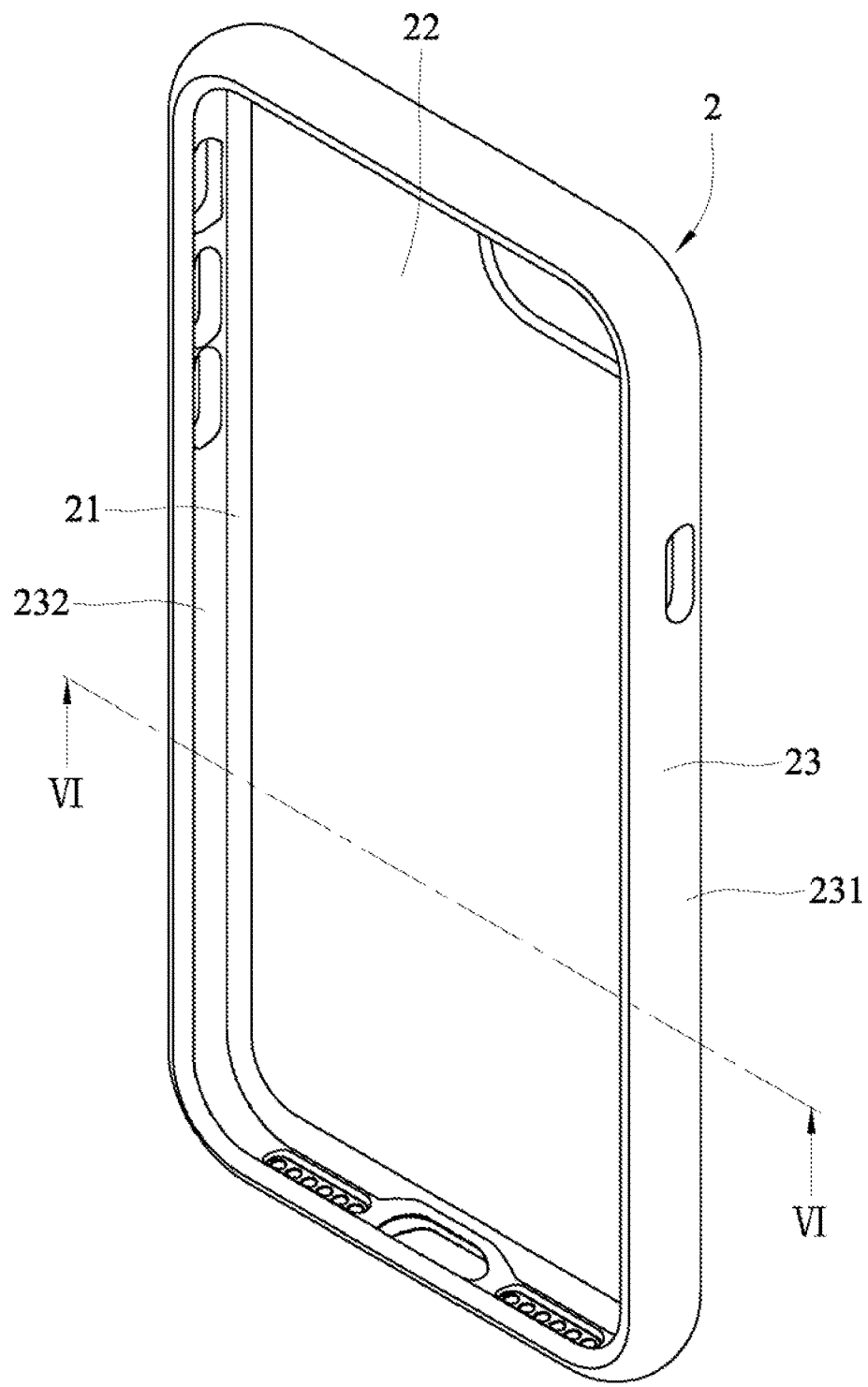
FIG. 5 is an assembled perspective view of the first embodiment.
Figure 6:
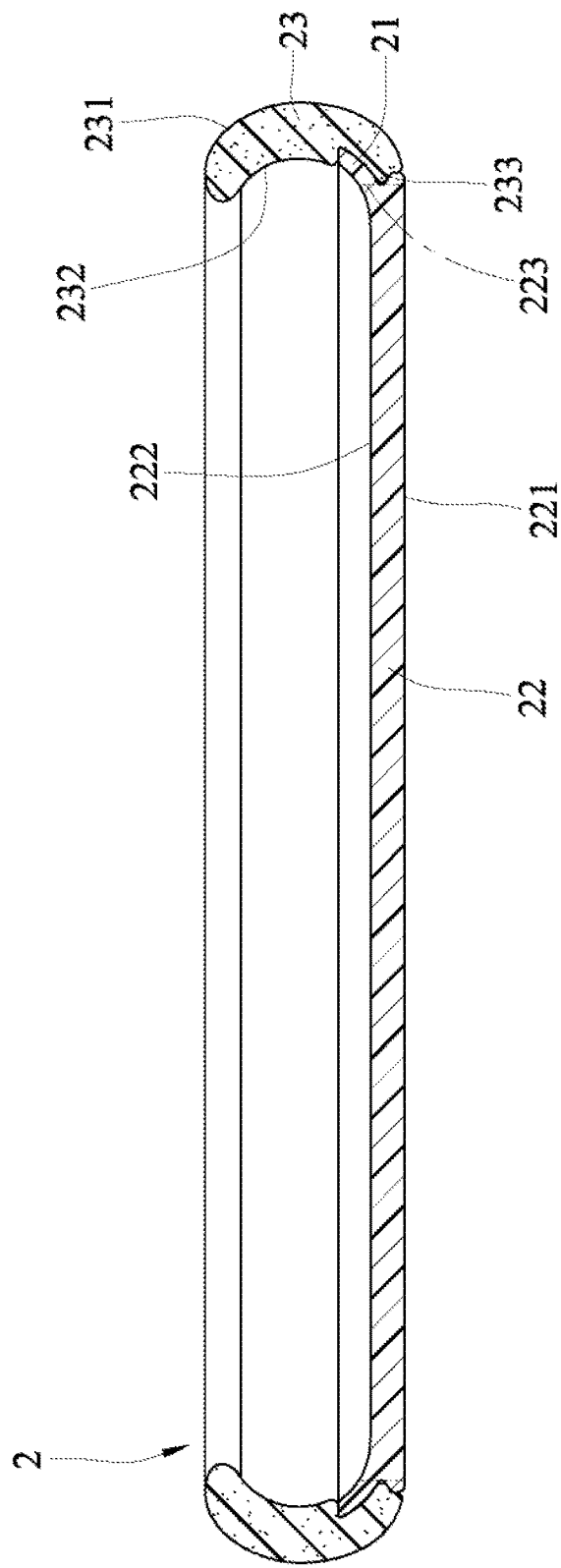
FIG. 6 is a sectional view taken along line VI-VI of FIG. 5.
Figure 7:
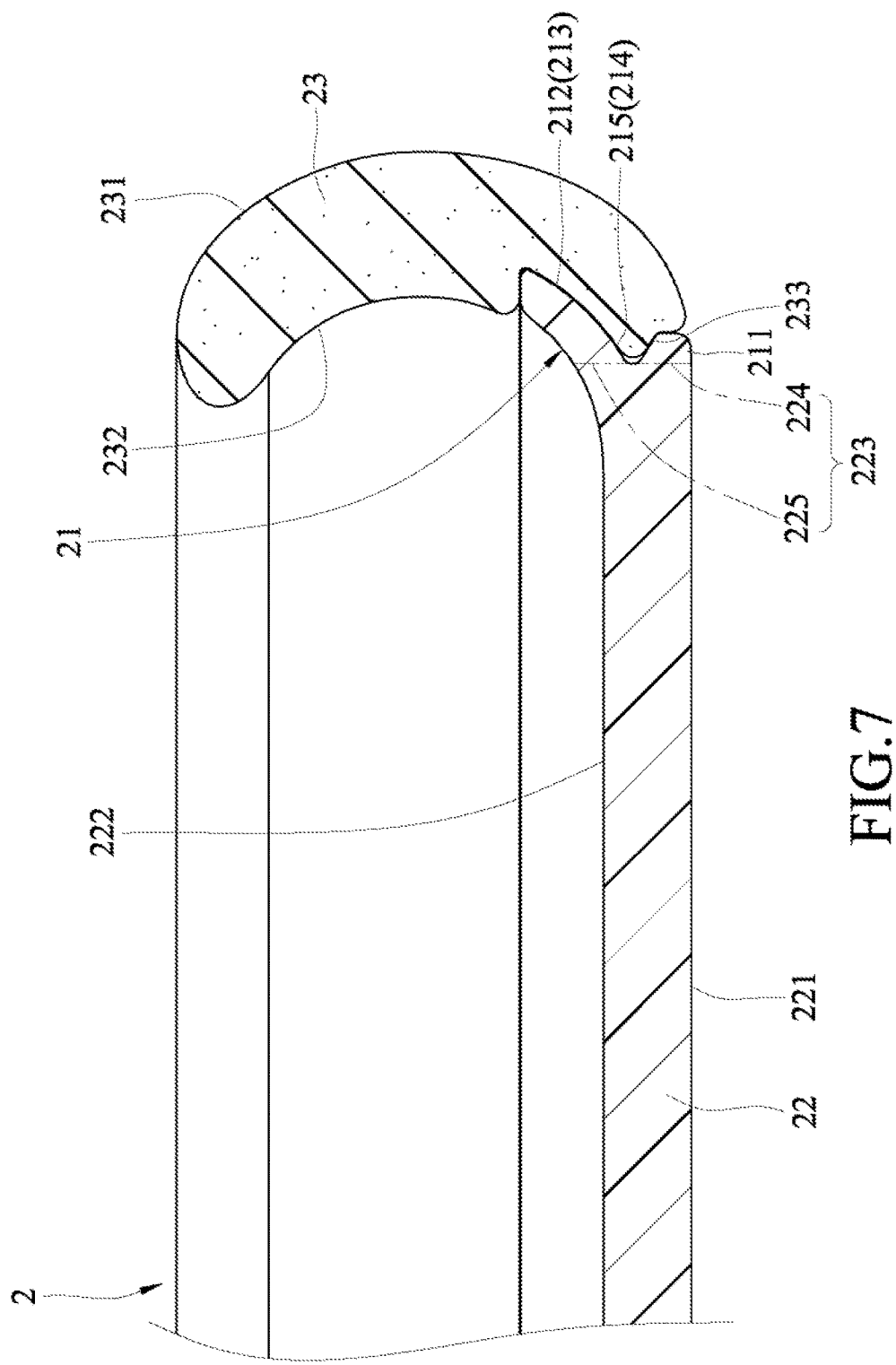
FIG. 7 is an enlarged fragmentary sectional view of FIG. 6.

From the foregoing, the advantages of this embodiment can be summarized as follows:

1) The first and second protrusions 211, 212 of the coupling unit 21 extend outwardly from the component outer peripheral surface 223 of the detachable component 22 and cooperate with each other to define therebetween the engaging groove 214 for receiving and engaging the casing body protrusion 215. In comparison with the coupling unit 11 of the conventional protective case assembly 1 (see FIGS. 1 to 3), the coupling unit 21 of this disclosure can effectively increase the contact area between the detachable component 22 and the casing body 23 during assembly so as to enhance the adhesion and stability between the two, so that the detachable component 22 will not easily detach from the casing body 23.

2) Through the configuration of the first protrusion 211, the second protrusion 212 and the main groove 213 of the coupling unit 21 of this disclosure, in comparison with the conventional coupling unit 11, apart from permitting the overall appearance of the protective case assembly 2 to present an effect of a single integral case, the coupling unit 21 can further permit the protective case assembly 2 to adhere more closely to the handheld device (not shown), so that the size of the protective case assembly 2 can be effectively reduced.

Figure 9:
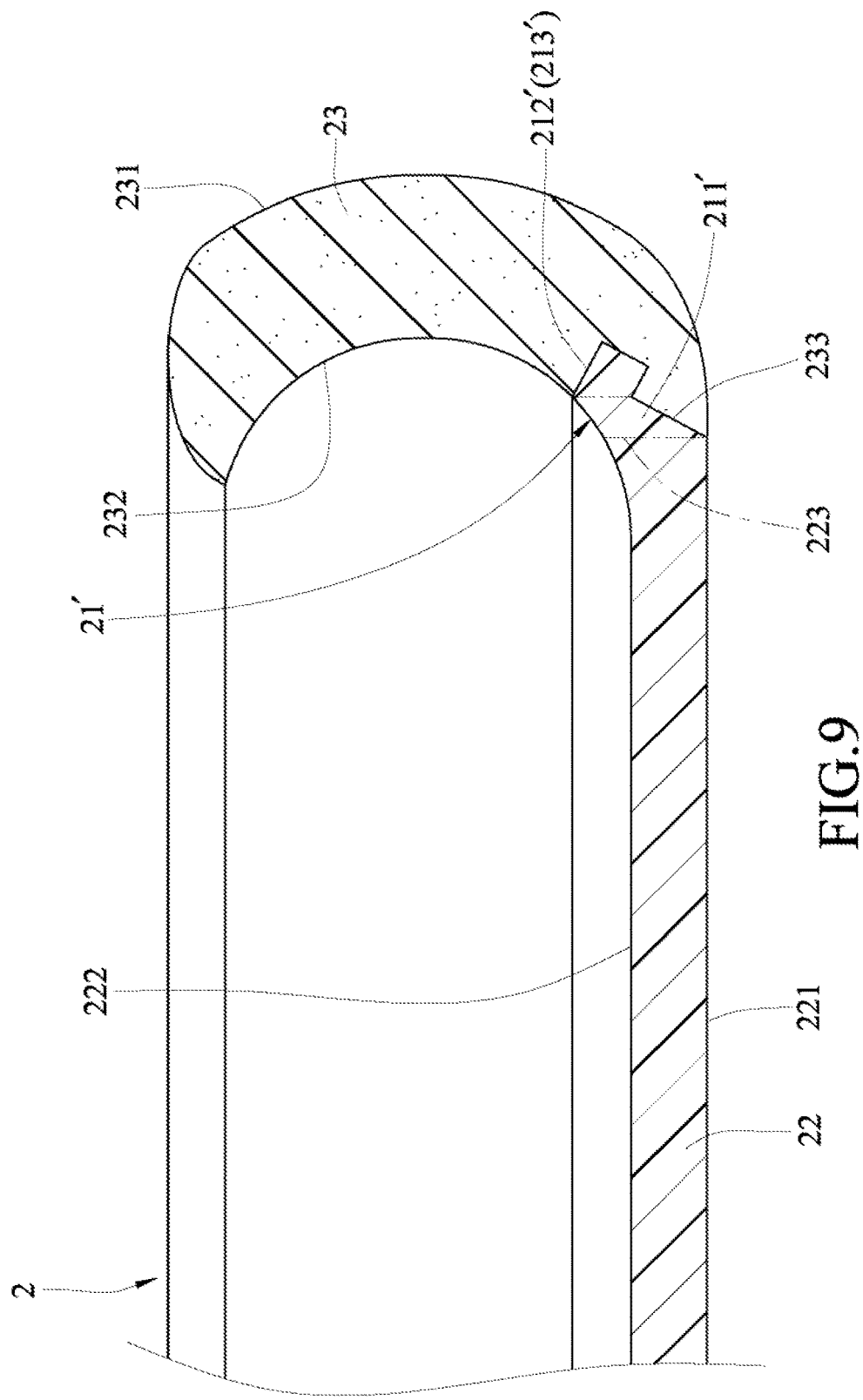
FIG. 9 is an enlarged fragmentary sectional view of a protective case assembly according to the second embodiment of this disclosure.

Referring to FIG. 9, the second embodiment of the protective case assembly 2 of this disclosure is shown to be generally identical to the first embodiment. However, in this embodiment, the first protrusion 211' of the coupling unit 21' extends outwardly and obliquely from the component outer peripheral surface 223 or the detachable component 22, and the second protrusion 212' of the coupling unit 21' extends transversely from the first protrusion 211' toward the casing body 23 for receiving in the main groove 213'. The first protrusion 211' abuts against the casing body rear peripheral edge surface 233 after the detachable component 22 is coupled to the casing body 23.

Figure 10:
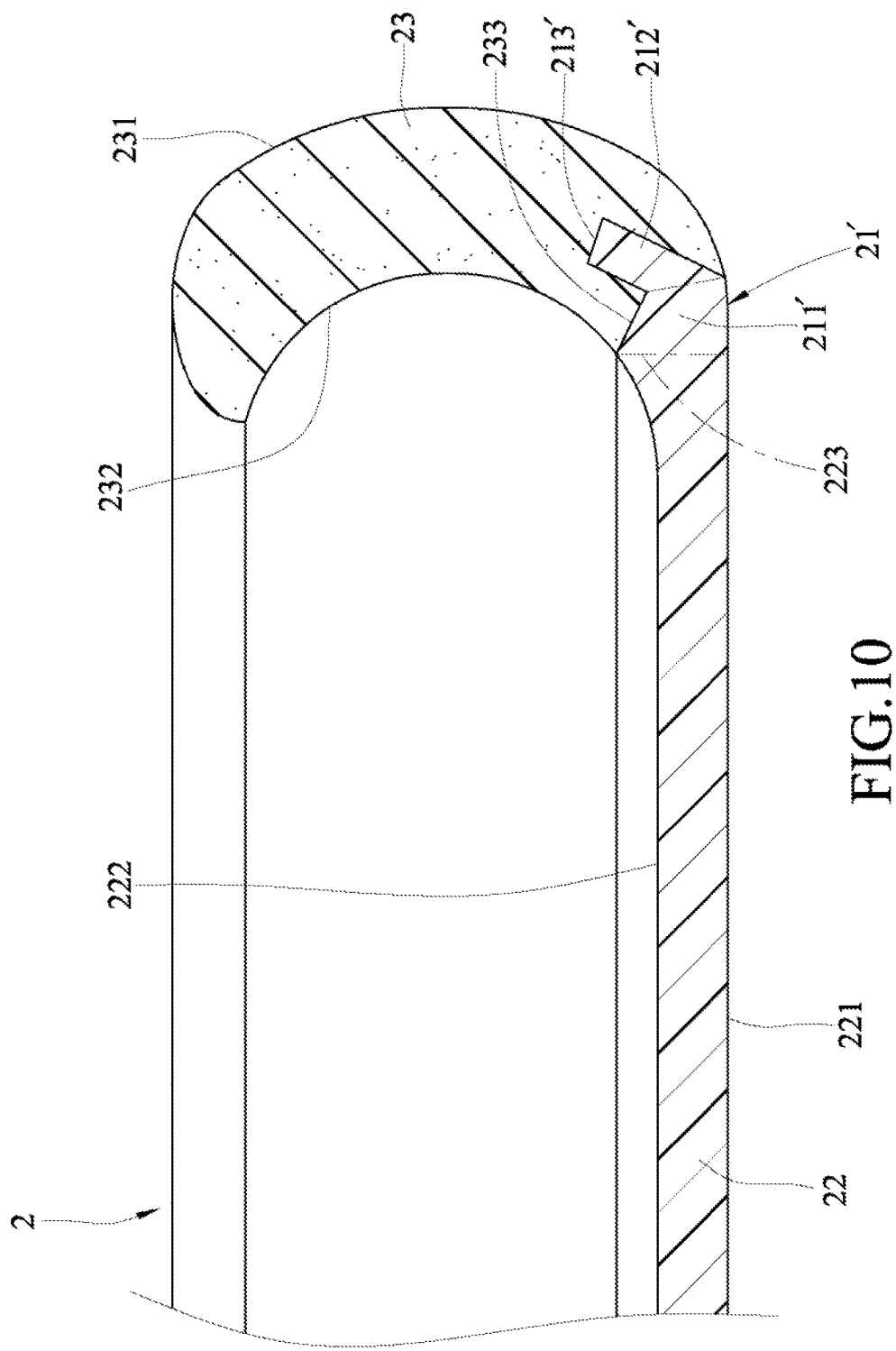
FIG. 10 is a view similar to FIG. 9, but illustrating an alternative form of the second embodiment.
Figure 11:
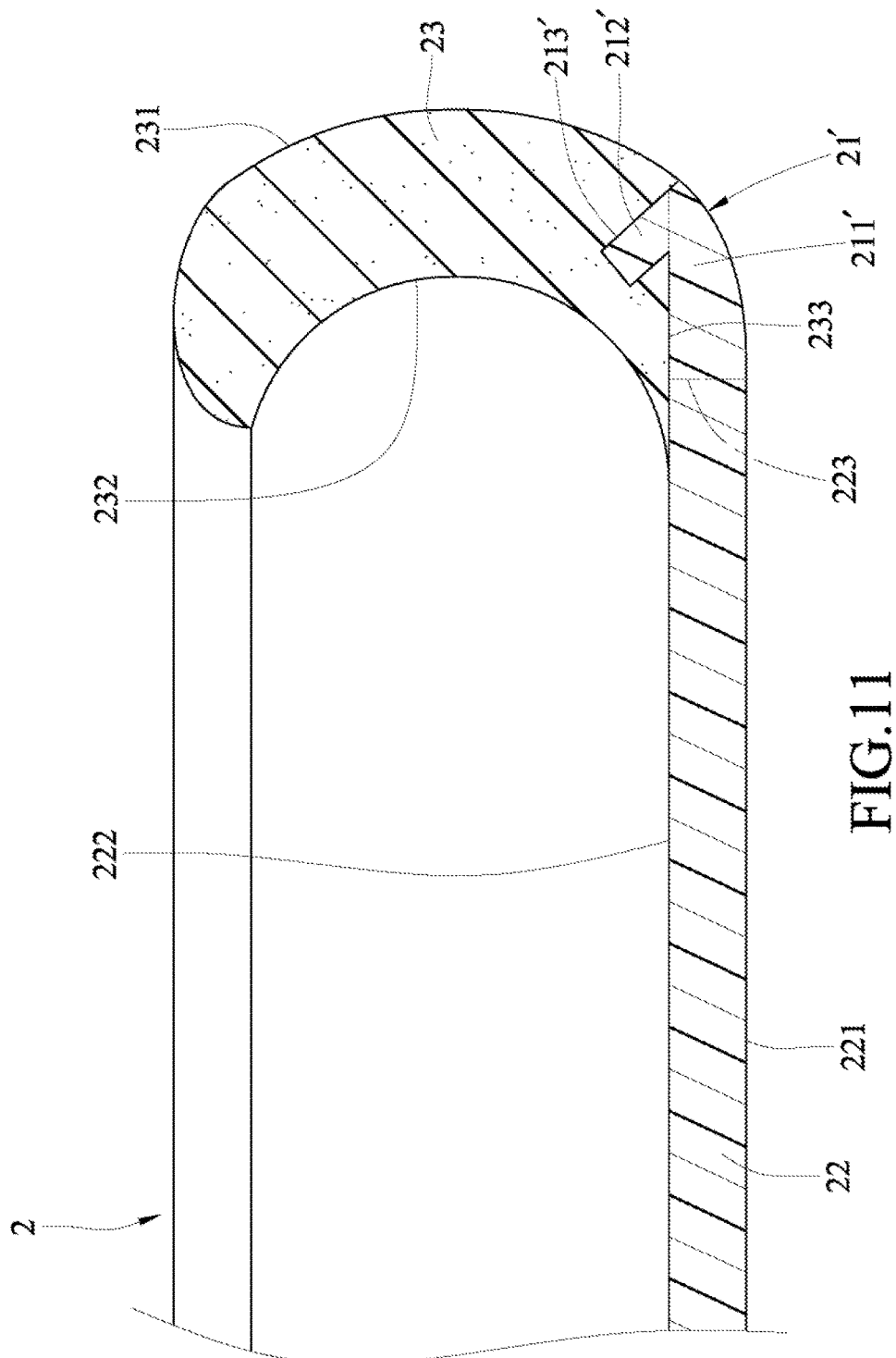
FIG. 11 is a view similar to FIG. 9, but illustrating another alternative form of the second embodiment.

FIG. 10 illustrates an alternative form of the second embodiment, in which the main groove 213' is formed in the casing body rear peripheral edge surface 233. FIG. 11 illustrates another alternative form of the second embodiment, in which the main groove 213' is formed in the casing body rear peripheral edge surface 233. proximate to the outer peripheral surface 231.

Apart from achieving the same advantages as those of the first embodiment, because the second protrusion 212' of the second embodiment extends transversely from the first protrusion 211', the second protrusion 212' is insertable in the main groove 213' in a bent manner, thereby strengthening its ability to resist external pulling.

Figure 12:
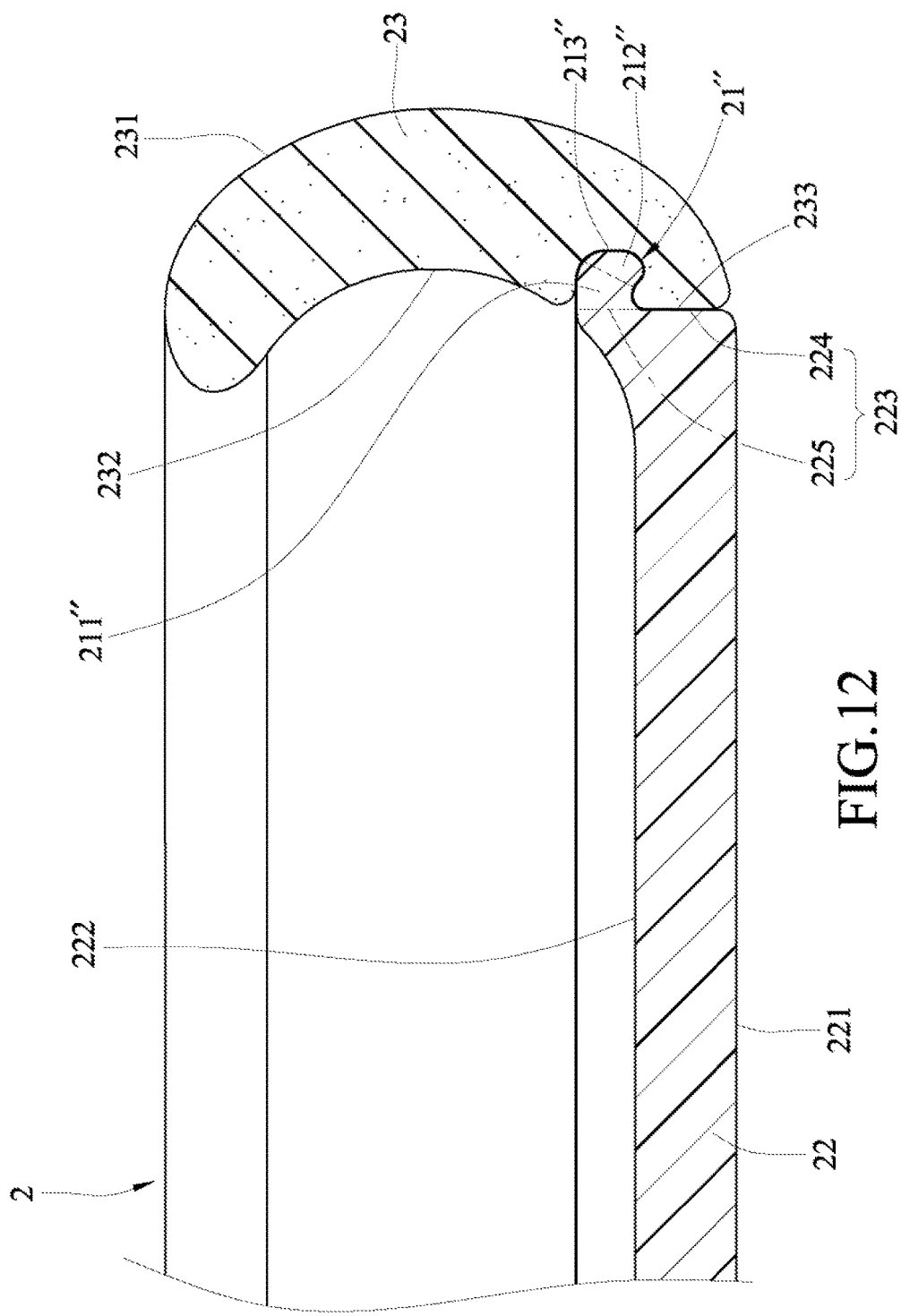
FIG. 12 is an enlarged fragmentary sectional view of a protective case assembly according to the third embodiment of this disclosure.

Referring to FIG. 12, the third embodiment of the protective case assembly 2 of this disclosure is shown to be generally identical to the first embodiment. However, in this embodiment, the first protrusion 211" of the coupling unit 21" extends outwardly from the second outer peripheral surface portion 225 of the component outer peripheral surface 223 and facing the outer peripheral surface 231, and the second protrusion 212" of the coupling unit 21" extends outwardly and curvedly from the first protrusion 211" toward the casing body 23. The second protrusion 212" cooperates with the first protrusion 211" to form a hook-like structure. The main groove 213" is formed in the casing body rear peripheral edge surface 233 proximate to the inner peripheral surface 232, and has a shape conforming to the hook-like structure defined by the first and second protrusions 211", 212" for receiving the same. The first outer peripheral surface portion 224 of the component outer peripheral surface 223 abuts against the casing body rear peripheral edge surface 233 after the detachable component 22 is coupled to the casing body 23.

Figure 13:
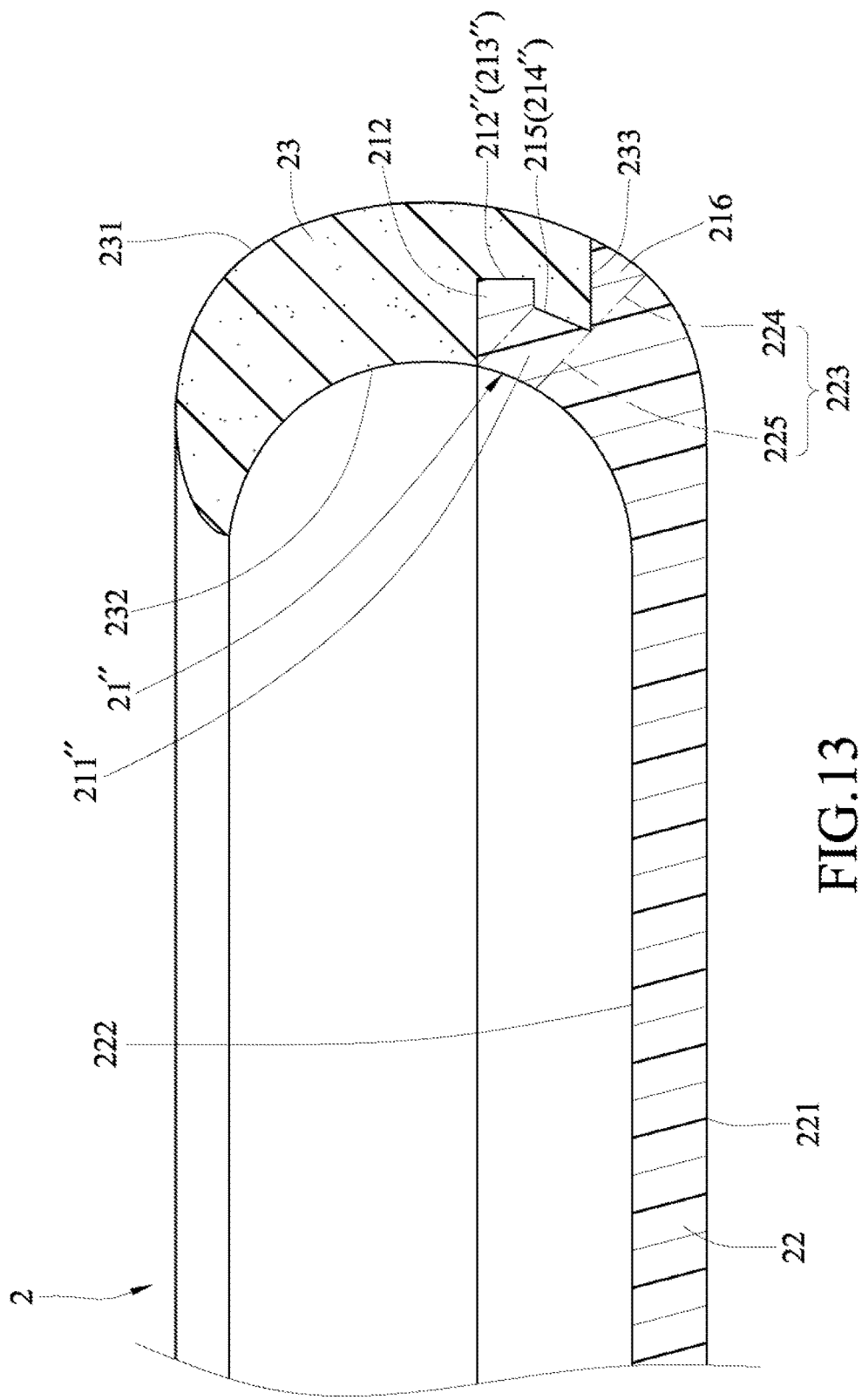
FIG. 13 is a view similar to FIG. 12, but illustrating an alternative form of the third embodiment.

FIG. 13 illustrates an alternative form of the third embodiment, in which the coupling unit 21" further includes a third protrusion 216 that is annular and that extends outwardly from the first outer peripheral surface portion 224 of the component outer peripheral surface 223. The third protrusion 216 cooperates with the first and second protrusions 211", 212" to define the engaging groove 214". After the detachable component 22 is coupled to the casing body 23, the casing body protrusion 215 is engaged with the engaging groove 214", and the third protrusion 216 abuts against the casing body rear peripheral edge surface 233.

Figure 14:
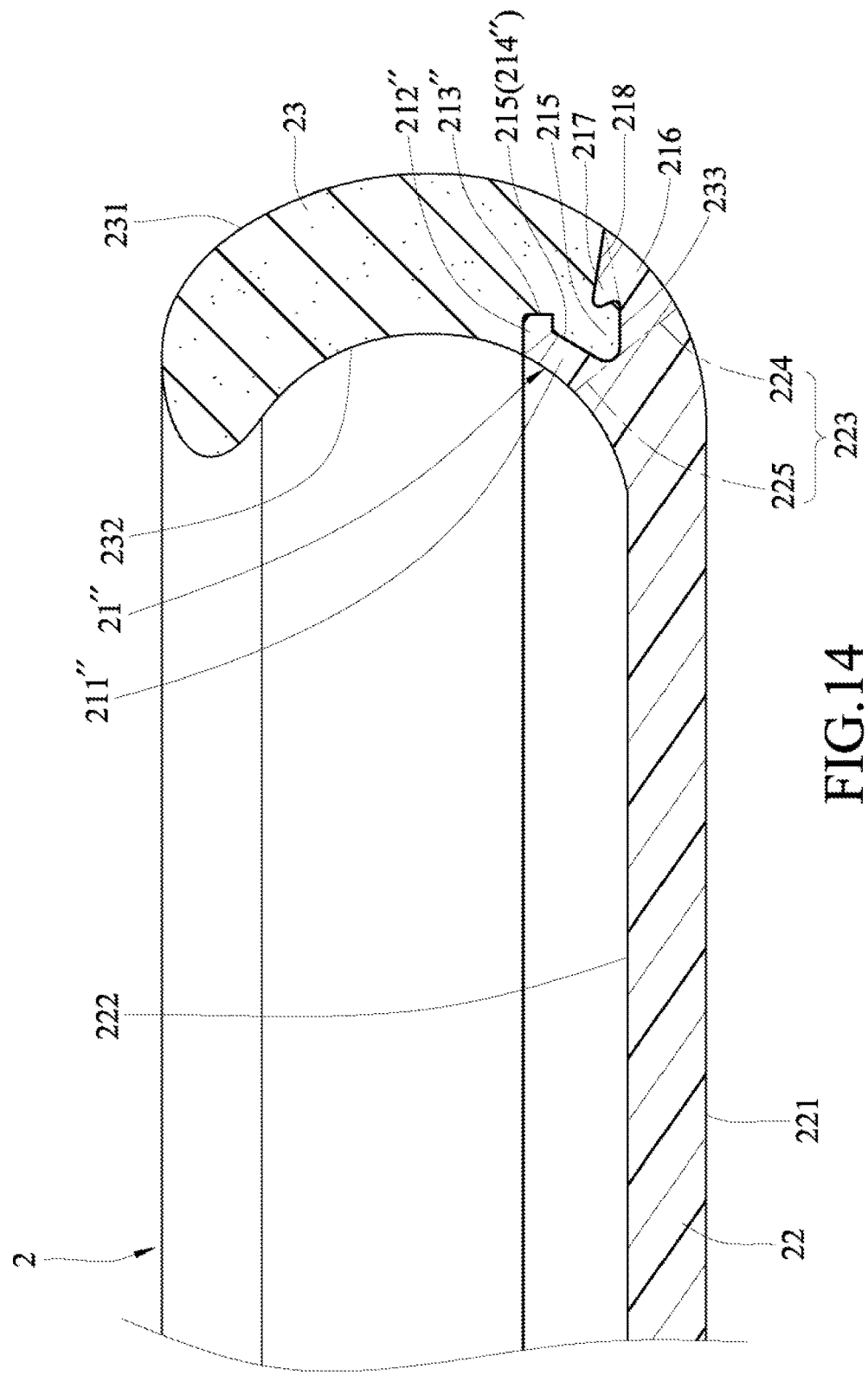
FIG. 14 is a view similar to FIG. 12, but illustrating another alternative form of the third embodiment.
Figure 15:
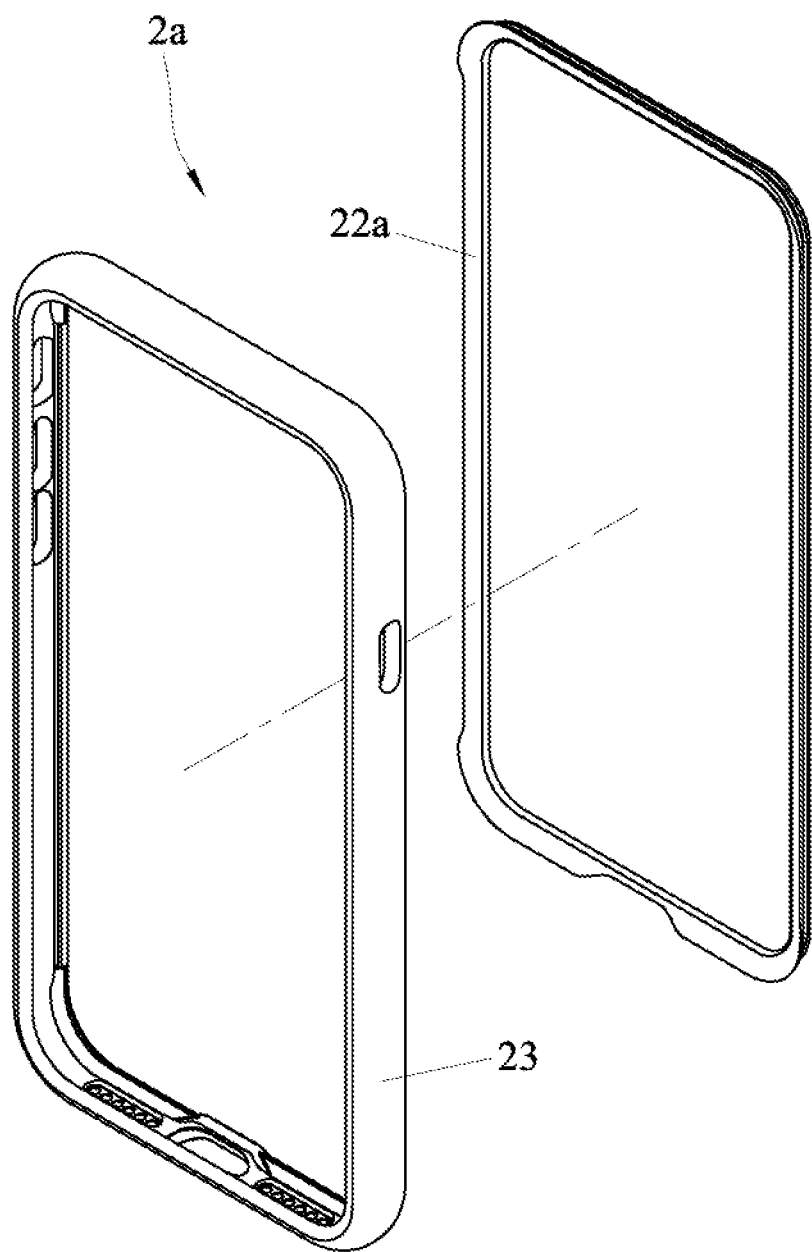
FIG. 15 is an exploded perspective view of a protective case assembly according to the fourth embodiment of this disclosure.
Figure 16:
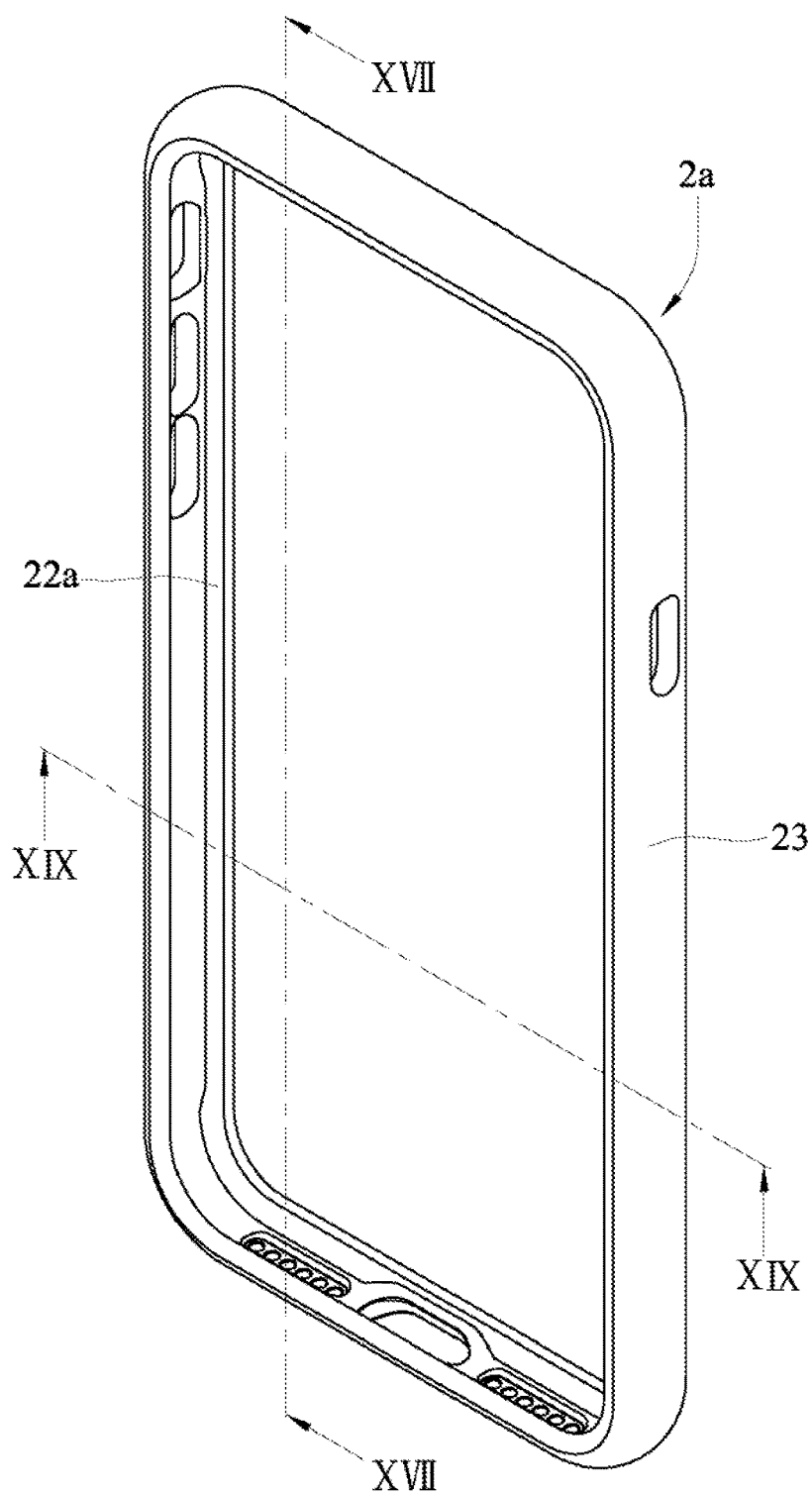
FIG. 16 is an assembled perspective view of the fourth embodiment.
Figure 17:
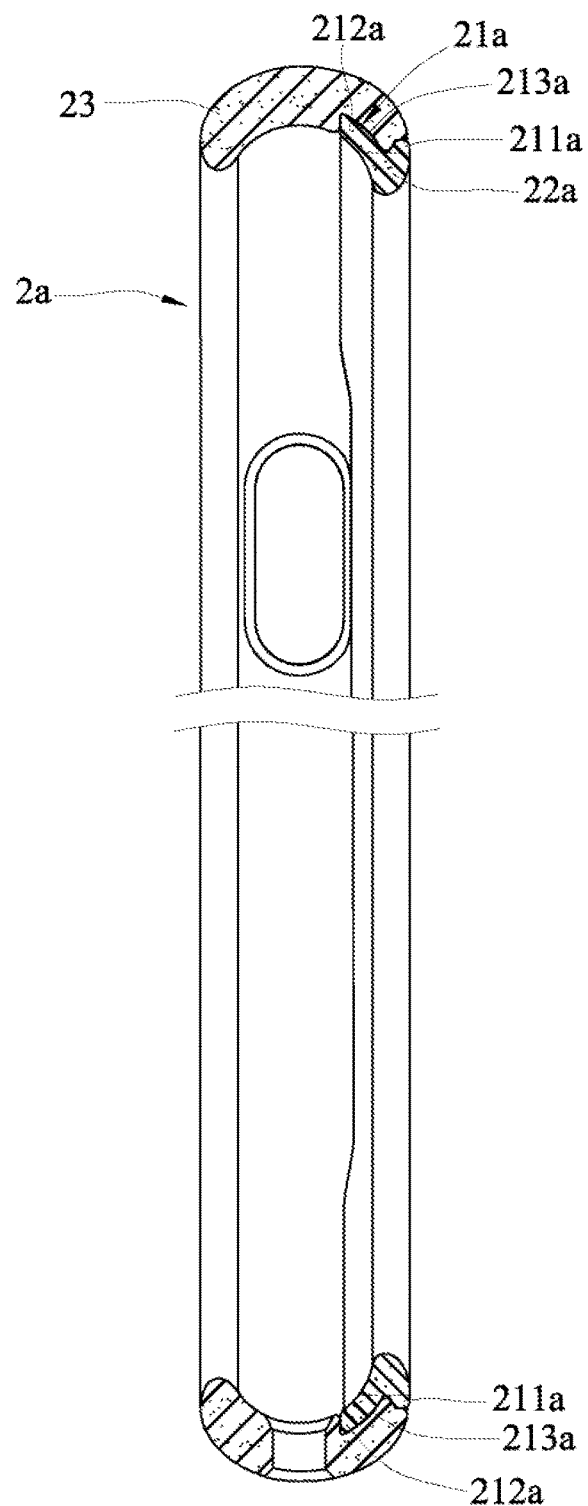
FIG. 17 is a sectional view taken along line XVII-XVII of FIG. 16.
Figure 18:
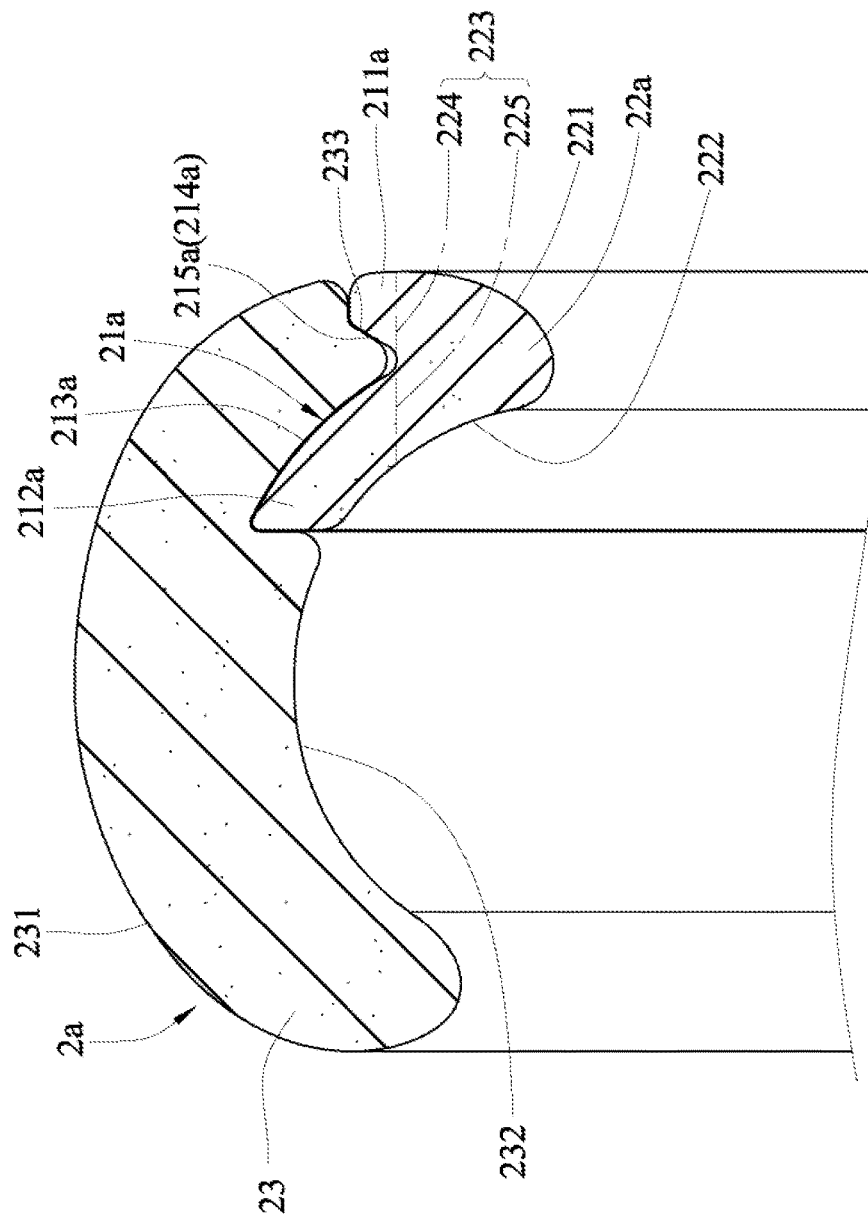
FIG. 18 is an enlarged fragmentary sectional view of FIG. 17.
Figure 19:
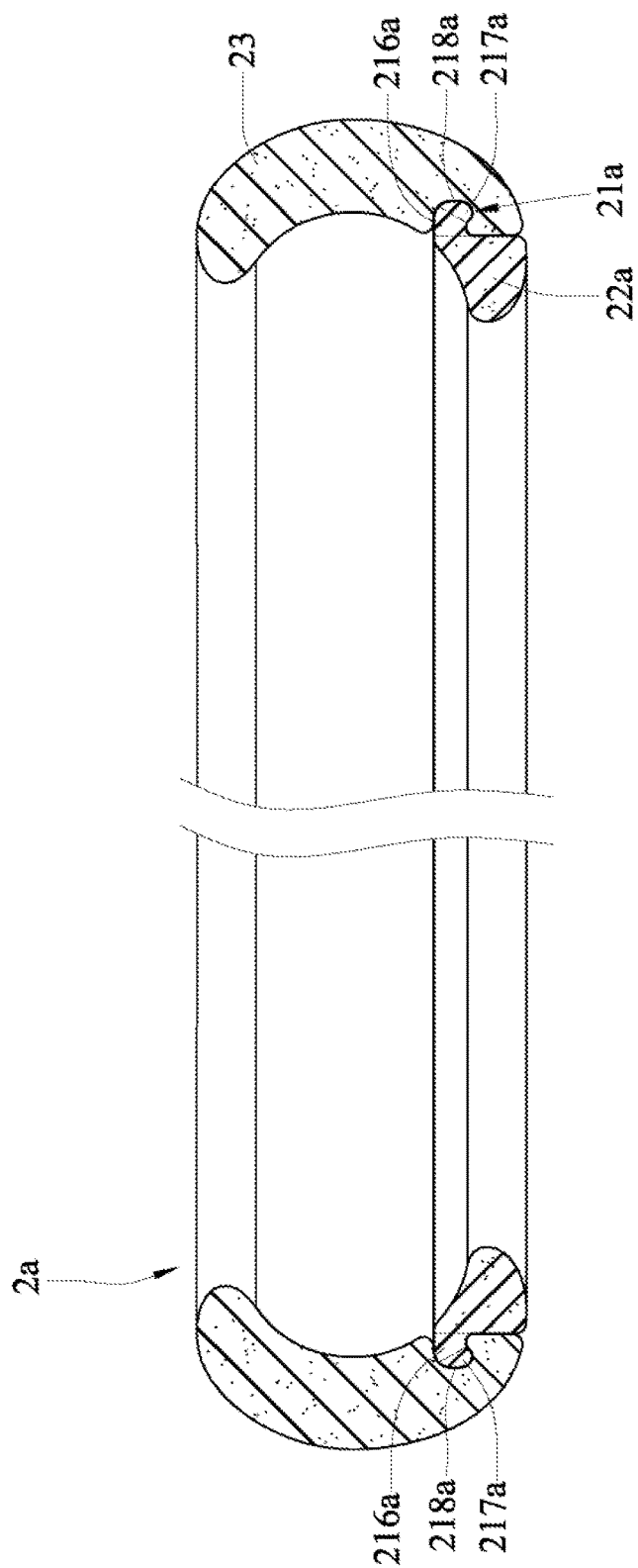
FIG. 19 is a sectional view taken along line XIX-XIX of FIG. 16.
Figure 20:
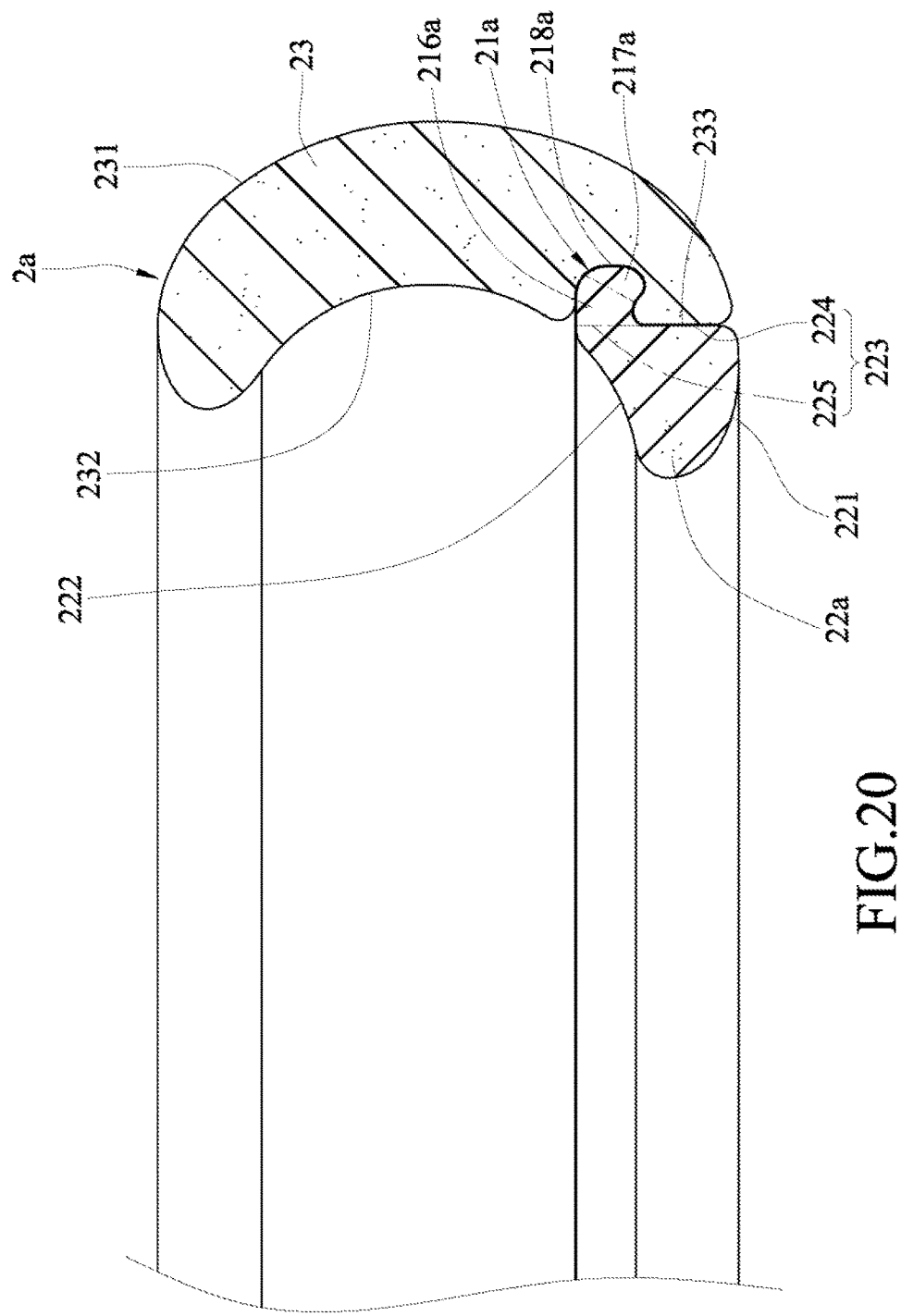
FIG. 20 is an enlarged fragmentary sectional view of FIG. 19.
Figure 21:
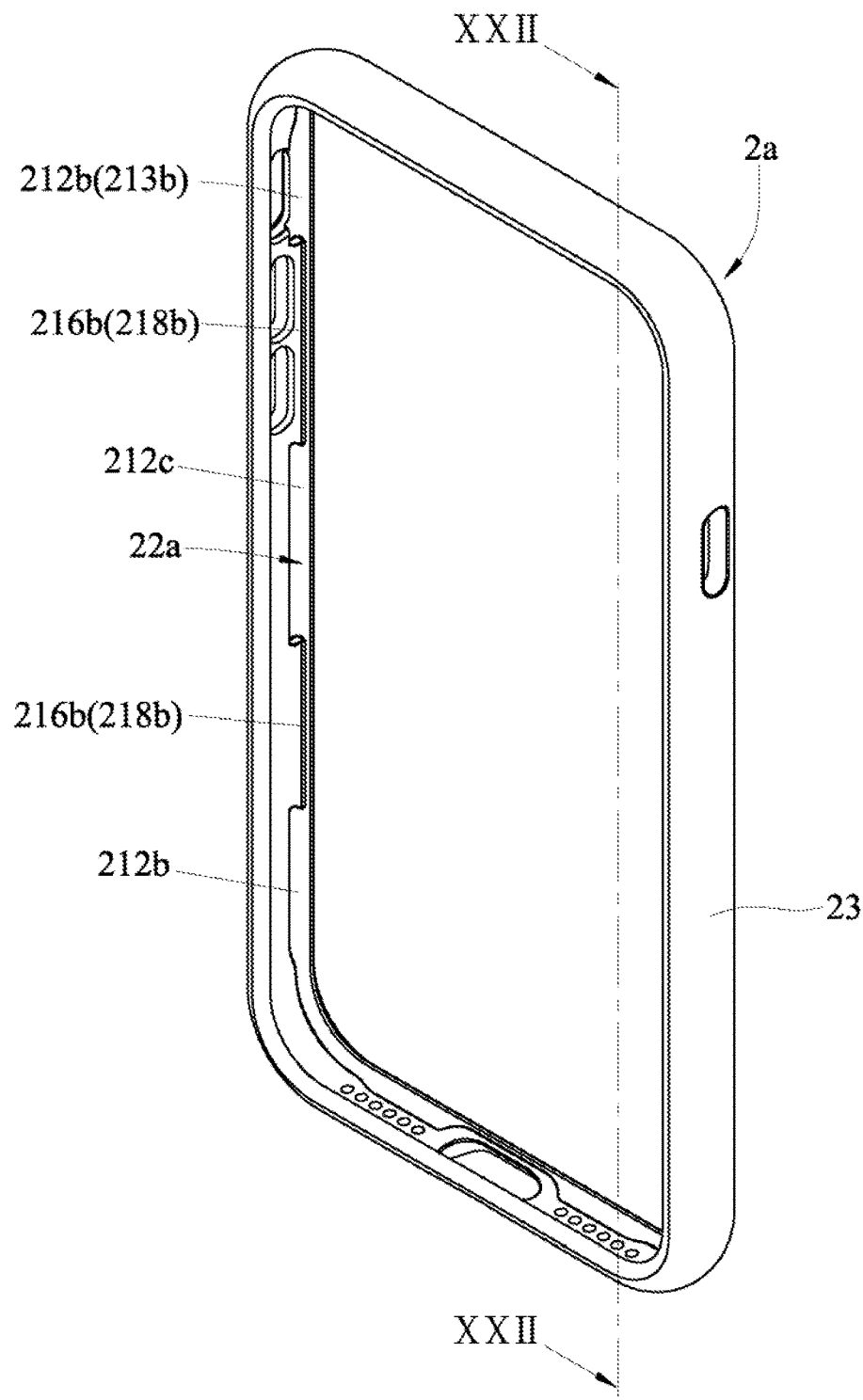
FIG. 21 is a perspective view of a protective case assembly according to the fifth embodiment of this disclosure.
Figure 22:
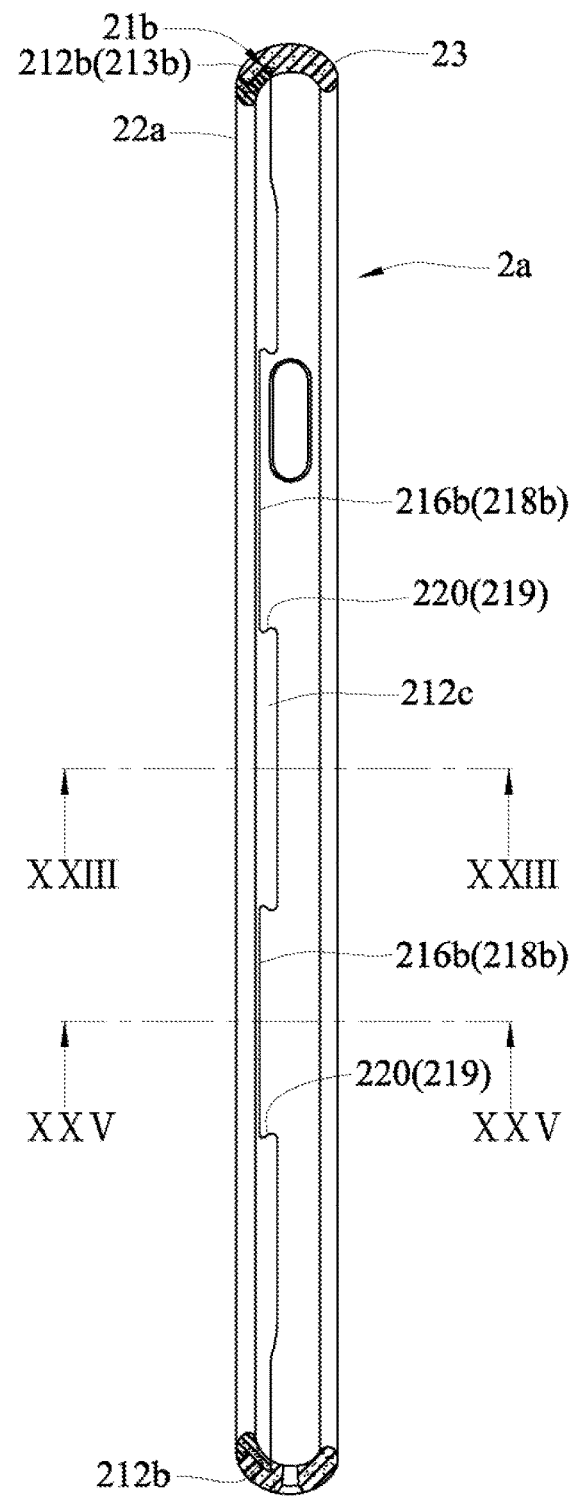
FIG. 22 is a sectional view taken along line XXII-XXII of FIG. 21.
Figure 23:
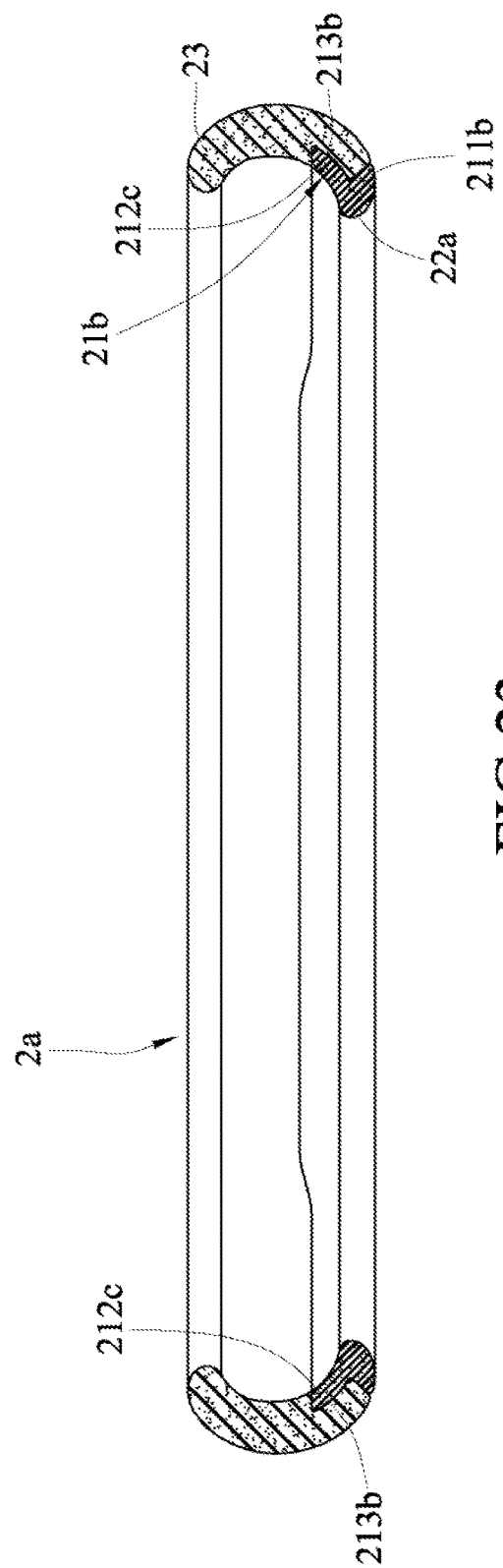
FIG. 23 is a sectional view taken along line XXIII-XXIII of FIG. 22.
Figure 24:
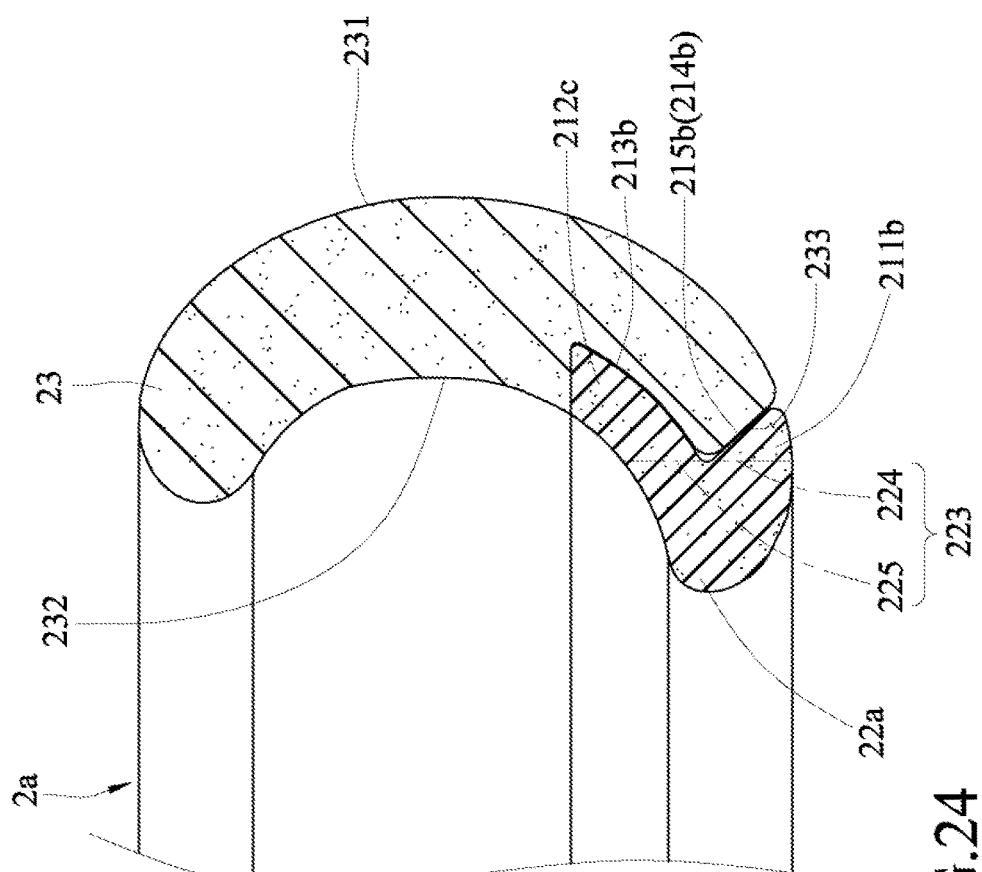
FIG. 24 is an enlarged fragmentary sectional view of FIG. 23.
Figure 25:
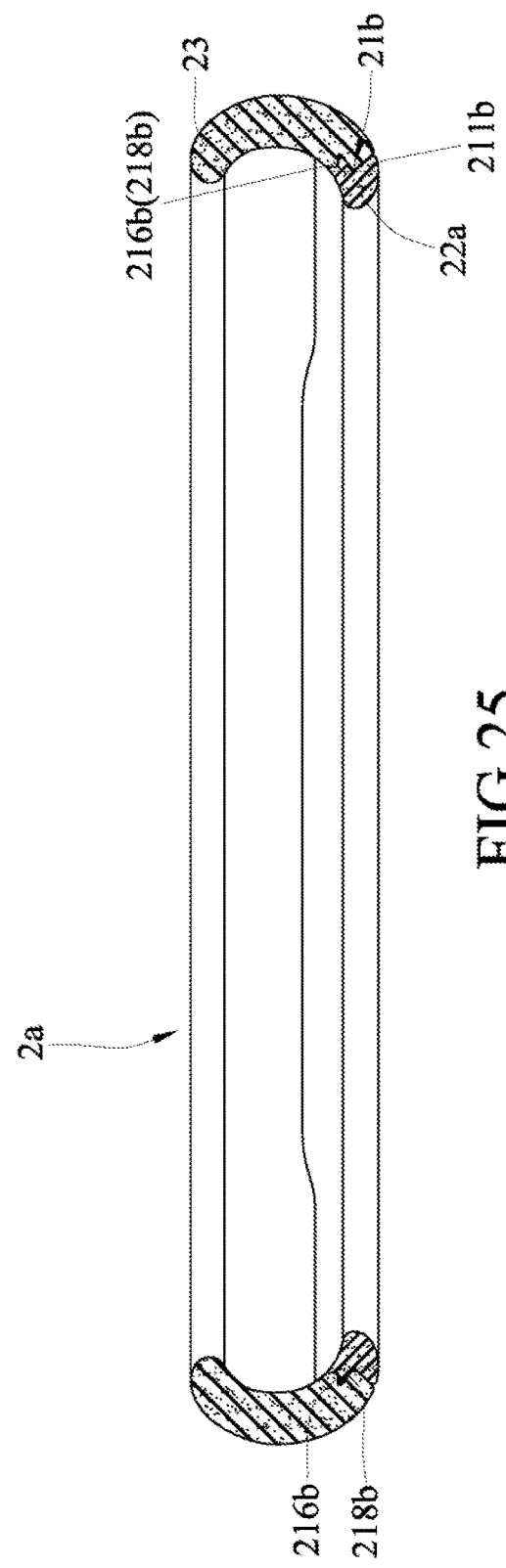
FIG. 25 is a sectional view taken along line XXV-XXV of FIG. 22.
Figure 26:
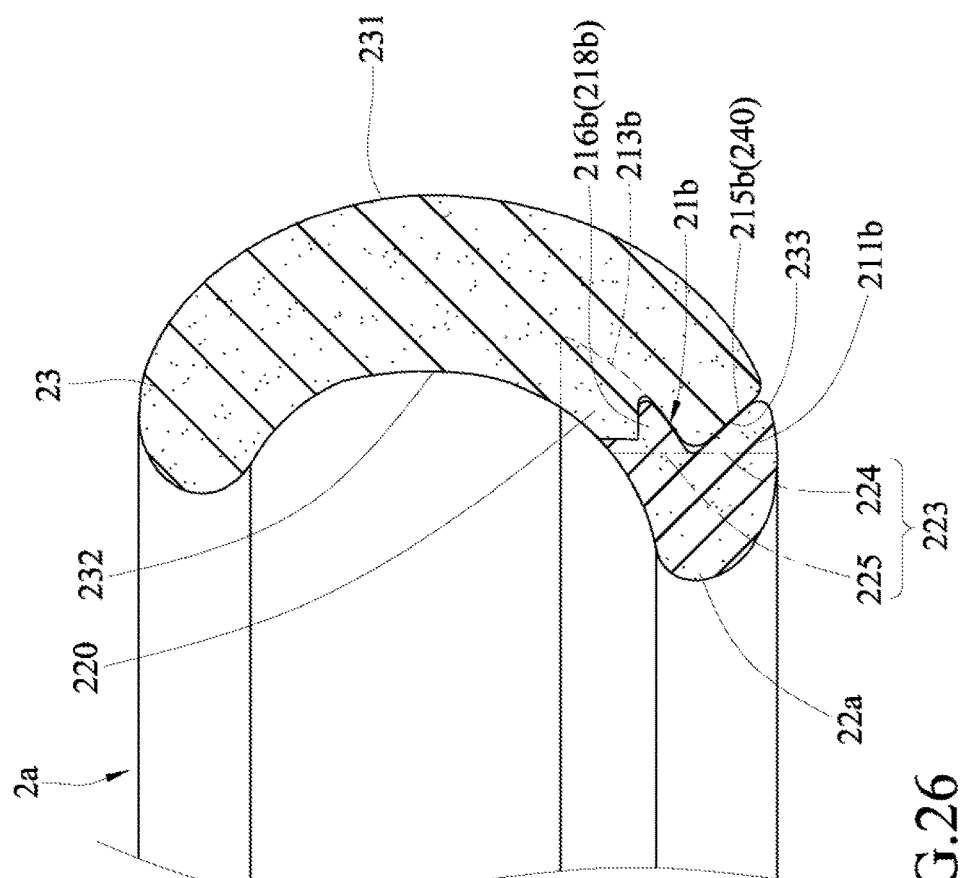
FIG. 26 is an enlarged fragmentary sectional view of FIG. 25.

FIG. 14 illustrates another alternative form of the third embodiment, in which the coupling unit 21" further includes a third protrusion 216 that is annular and that extends outwardly from the first outer peripheral surface portion 224 of the component outer peripheral surface 223, a fourth protrusion 217 that is annular and that extends transversely from the third protrusion 216 toward the casing body 23, and an auxiliary groove 218 that is annular and that is formed in the casing body rear peripheral edge surface 233. The third protrusion 216 coop crates with the first protrusion 211" to define therebetween the engaging groove 214". The main groove 213" is formed in the inner peripheral surface 232. The casing body protrusion 215 is formed on the casing body rear peripheral edge surface 233 between the main groove 213" and the auxiliary groove 218. After the detachable component 22 is coupled to the casing body 23, the casing body protrusion 215 is engaged with the engaging groove 214", the third protrusion 216 abuts against the casing body rear peripheral edge surface 233, and the fourth protrusion 217 is engaged with the auxiliary groove 218.

Apart from achieving the same advantages as those of the first embodiment, the third embodiment utilizes the engagement between the hook-like structure formed by the first and second protrusions 211", 212" with the hook-like main groove 213" and utilizes the presence of the third and fourth protrusions 216, 217 in the alternative embodiments so as to strengthen the connection between the detachable component 22 and the casing body 23.

Referring to FIGS. 15 to 20, the protective case assembly (2a) according to the fourth embodiment of the present disclosure is shown to be generally identical to the first embodiment. However, in this embodiment, the detachable component (22a) is exemplified as an annular rectangular frame having two opposite short sides and two opposite long sides connected between the short sides. The short sides of the detachable component (22a) extend in a left-right direction, while the long sides thereof extend in a top-bottom direction. However, the extending direction of the short sides and the long sides of the detachable component (22a) may be interchanged. The casing body 23 has two short sides corresponding to the short sides of the detachable component (22a), and two long sides corresponding to the long sides of the detachable component (22a).

Further, in this embodiment, the coupling unit (21a) includes two first protrusions (211a), two second protrusions (212a), two main grooves (213a), two third protrusions (216a), two fourth protrusions (217a) and two auxiliary grooves (218a). The first protrusions (211a) are disposed on the short sides of the detachable component (22a). Each first protrusion (211a) extends outwardly from the first outer peripheral surface portion 224 of the component outer peripheral surface 223 of the detachable component (22a) toward the casing body 23, and has a length extending in the left-right direction. The second protrusions (212a) are also disposed on the short sides of the detachable component (22a). Each second protrusion (212a) extends outwardly from the second outer peripheral surface portion 225 of the component outer peripheral surface 223 of the detachable component (22a) toward the casing body 23, and also has a length extending in the left-right direction. Each first protrusion (211a) and a respective one of the second protrusions (212a) cooperate with each other to define therebetween the engaging groove (214a).

The main grooves (213a) are respectively disposed on the short sides of the casing body 23. Each main groove (213a) is formed in the inner peripheral surface 232 of the casing body 23. The casing body rear peripheral edge surface 233 is formed with two casing body protrusions (215a) each of which is immediately adjacent to a respective one of the main grooves (213a). After the detachable component (22a) is assembled to the casing body 23 are, the second protrusions (212a) are respectively received in the main grooves (213a), the casing body protrusions (215a) are respectively engaged with the engaging grooves (214a), and each first protrusion (211a) abuts against the casing body rear peripheral edge surface 233.

The third protrusions (216a) are disposed on the long sides of the detachable component (22a). Each third protrusion (216a) extends outwardly from the second outer peripheral surface portion 225 of the component outer peripheral surface 223 toward the casing body 23, and has a length extending in the top-bottom direction. Each fourth protrusion (217a) extends outwardly and curvedly from a respective one of the third protrusions (216a) toward the casing body 23, and cooperates with the same to form a hook-like structure. The auxiliary grooves (218a) are respectively disposed on the long sides of the casing body 23. Each auxiliary groove (218a) is formed in the casing body rear peripheral edge surface 233 in proximity to the inner peripheral surface 232 of the casing body 23, and has a shape conforming to the hook-like structure formed by the third and fourth protrusions (216a, 217a) for receiving and engaging the same. The first outer peripheral surface portion 224 of the component outer peripheral surface 223 abuts against the casing body rear peripheral edge surface 233 after the detachable component (22a) is assembled to the casing body 23.

Apart from achieving the same advantages as those of the first embodiment, the fourth embodiment utilizes the engagement between the hook-like structure formed by the third and fourth protrusions (216a, 217a) and the respective auxiliary groove (218a) on each long side of the protective case assembly (2a) to strengthen the connection between the detachable component (22a) and the casing body 23 at the long sides thereof, and utilizes the engagement between the casing body protrusions (215a) and the respective engaging grooves (214a) on each short side of the protective ease assembly (2a) to permit easy detachment of the short sides of the detachable component (22a) relative to the long sides thereof, thereby facilitating replacement of the detachable component (22a).

Referring to FIGS. 21 to 26, the protective case assembly (2a) according to the fifth embodiment of the present disclosure is shown to be generally identical to the fourth embodiment. Particularly, the detachable component (22a) is exemplified as an annular rectangular frame having two opposite short sides and two opposite long sides. The casing body 23 has two short sides corresponding to the short sides of the detachable component (22a), and two long sides corresponding to the long sides of the detachable component (22a). However, in this embodiment, the coupling unit (21b) includes a single first protrusion (211b), four second protrusions (212b, 212c), four third protrusions (216b), a single main groove (213b) and four auxiliary grooves (218b).

The first protrusion (211b) is annular, and extends outwardly from the first outer peripheral surface portion 224 of the component outer peripheral surface 223 of the detachable component (22a) toward the casing body 23.

Two of the second protrusions (212b) are disposed on the short sides of the detachable component (22a) and has a substantially U-shape, while the other two second protrusions (212c) are disposed on the long sides thereof and has a length extending in the top-bottom direction. Each second protrusion (212b, 212c) extends outwardly from the second outer peripheral surface portion 225 of the component outer peripheral surface 223 toward the casing body 23. The first protrusion (211b) cooperates with a corresponding one of the second protrusions (212b, 212c) to define therebetween engaging groove (214b).

The main groove (213b) is annular, and is formed in the inner peripheral surface 232 of the casing body 23 for receiving the second protrusions (212b, 212c).

Each two of the third protrusions (216b) are disposed on a corresponding one of the long sides of the detachable component (22a), and are spaced apart from each other in the top-bottom direction. Each third protrusion (216b) extends outwardly from the second outer peripheral surface portion 225 of the component outer peripheral surface 223, and cooperates with the first protrusion (211b) to define therebetween an engaging groove (240). Each third protrusion (216b) is located between one of the second protrusions (212b) and a corresponding one of the second protrusions (212c), such that each second protrusion (212c) is flanked by two of the third protrusions (216) disposed on the same side.

A length of each second protrusion (212b, 212c) extending from the component outer peripheral surface 223 is longer than a length of each third protrusion (216b) extending from the same. Each third protrusion (216b) cooperates with one of the second protrusions (212b) and the corresponding second protrusion (212c) to define a dovetail groove 219.

The casing body rear peripheral edge surface 233 is formed with a single casing body protrusion (215b) that is annular. The inner peripheral surface 232 of the casing body 23 has two dovetail protrusions 220 formed on each of the long sides of the casing body 23 and spaced apart from each other in the top-bottom direction. The dovetail protrusions 220 are located inwardly of the casing body protrusion (215b).

Each two of the auxiliary grooves (218b) are disposed on a corresponding one of the long sides of the casing body 23, and are formed in the inner peripheral surface 232 of the casing body 23.

After the detachable component (22a) is coupled to the casing body 23, each of the second protrusions (212b, 212c) is received in the main groove (213b), each third protrusion (216b) is engaged with a respective one of the auxiliary grooves (218b), each dovetail protrusion 220 is engaged with the dovetail groove 219 defined by each third protrusion (216b) with one of the second protrusions (212b) and the corresponding second protrusion (212c), and the first protrusion (211b) abuts against the casing body rear peripheral edge surface 233. Further, the casing body protrusion (215b) is engaged with the engaging groove (214b) defined by the first protrusion (211b) and the corresponding second protrusion (212b, 212c) and with the engaging groove 240 defined by the first protrusion (211b) and the corresponding third protrusion (216b).

Apart from achieving the same advantages as those of the fourth embodiment, the fifth embodiment utilizes the addition of the dovetail engaging structure to the original engaging method of the casing body protrusion (215b) with the engaging groove (214b) defined by the first protrusion (211b) and the corresponding second protrusion (212b, 212c) and with the engaging groove 240 defined by the first protrusion (211b) and the corresponding third protrusion (216b), the coupling strength between the detachable component (22a) and the casing body 23 can be enhanced so that it is not easy for the detachable component (22a) to detach from the casing body 23.

In summary, the coupling unit 21, 21', 21", 21a, 21b of the protective case assembly 2, 2a of this disclosure not only can strengthen and stabilize the connection between the detachable component 22, 22a and the casing body 23, but also can prevent easy removal of the detachable component 22, 22a from the casing body 23. Further, the protective case assembly 2, 2a can adhere more closely against the handheld device to thereby reduce the volume thereof. Hence, the object of this disclosure can indeed be achieved.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A protective case assembly for a handheld device, comprising:
    a detachable component having a component outer peripheral surface;
    a casing body having a casing body rear peripheral edge surface formed with at least one casing body protrusion; and
    a coupling unit detachably coupling said detachable component to said casing body, said coupling unit including
    at least one first protrusion extending outwardly from said component outer peripheral surface, wherein said at least one first protrusion is annular,
    at least one second protrusion extending outwardly from one of said at least one first protrusion and said component outer peripheral surface, said at least one second protrusion cooperating with said at least one first protrusion to define therebetween an engaging groove for engaging with said at least one casing body protrusion; and
    at least one main groove formed in said casing body for receiving said at least one second protrusion.

2. The protective case assembly as claimed in claim 1, wherein:
    said casing body has an outer peripheral surface and an inner peripheral surface opposite to said outer peripheral surface, said casing body rear peripheral edge surface interconnecting said outer and inner peripheral surfaces; and
    said detachable component has a first surface facing said casing body, and a second surface opposite to said first surface, said component outer peripheral surface interconnecting said first and second surfaces and including a first outer peripheral surface portion connected to said first surface, and a second outer peripheral surface portion connected to said second surface and said first outer peripheral surface portion.

3. The protective case assembly as claimed in claim 2, wherein:
    said at least one second protrusion includes a single second protrusion that is annular and that extends outwardly from one of said at least one first protrusion and said component outer peripheral surface;
    said at least one main groove includes a single main groove that is annular and that is formed in one of said inner peripheral surface and said casing body rear peripheral edge surface of said casing body; and said casing body protrusion is annular, is immediately adjacent to said annular main groove, and is engageable with said engaging groove.

4. The protective case assembly as claimed in claim 3, wherein:
said at least one first protrusion extends outwardly from said first outer peripheral surface portion of said component outer peripheral surface and that is abuttable against said casing body rear peripheral edge surface;
said at least one second protrusion extends outwardly from said second outer peripheral surface portion of said component outer peripheral surface and cooperates with said at least one first protrusion to define therebetween said engaging groove; and
said at least one main groove is formed in said inner peripheral surface of said casing body for receiving said at least one second protrusion.

5. The protective case assembly as claimed in claim 3, wherein said at least one second protrusion extends transversely from said at least one first protrusion toward said casing body for receiving in said at least one main groove.

6. The protective case assembly as claimed in claim 5, wherein said at least one main groove is formed in said inner peripheral surface of said casing body.

7. The protective case assembly as claimed in claim 5, wherein said at least one main groove is formed in said casing body rear peripheral edge surface.

8. The protective case assembly as claimed in claim 3, wherein said at least one first protrusion extends outwardly from said second outer peripheral surface portion of said component outer peripheral surface.

9. The protective case assembly as claimed in claim 8, wherein said at least one second protrusion extends transversely from said at least one first protrusion toward said casing body.

10. The protective case assembly as claimed in claim 9, further comprising a third protrusion that is annular, that extends outwardly from said first outer peripheral surface portion of said component outer peripheral surface, and that cooperates with said at least one first protrusion and said at least one second protrusion to define said engaging groove, said third protrusion being abuttable against said casing body rear peripheral edge surface.

11. The protective case assembly as claimed in claim 10, further comprising a fourth protrusion that is annular and that extends transversely from said third protrusion toward said casing body, and an auxiliary groove that is annular and that is formed in said casing body rear peripheral edge surface for receiving said fourth protrusion.

12. The protective case assembly as claimed in claim 8, wherein said at least one second protrusion extends outwardly and curvedly from said at least one first protrusion toward said casing body.

13. The protective case assembly as claimed in claim 2, wherein:
said casing body has two spaced-apart first sides and two spaced-apart second sides connected between said first sides; and
said detachable component has two first sides corresponding to said first sides of said casing body, and two second sides corresponding to said second sides of said casing body.

14. The protective case assembly as claimed in claim 13, wherein:
said at least one first protrusion includes at least two first protrusions disposed on said two first sides of said detachable component and extend outwardly from said first outer peripheral surface portion of said component outer peripheral surface;
said at least one second protrusion includes at least two second protrusions disposed on said two first sides of said detachable component and extend outwardly from said second outer peripheral surface portion of said component outer peripheral surface, each of said at least two second protrusions cooperating with a respective one of said at least two first protrusions to define therebetween said engaging groove;
said at least one main groove includes at least two main grooves disposed on said two first sides of said casing body and formed in said inner peripheral surface of said casing body for receiving said at least two second protrusions, respectively;
said casing body rear peripheral edge surface is formed with two casing body protrusions each of which is immediately adjacent to a respective one of said at least two main grooves, said engaging groove defined by one of said at least two second protrusions and the respective one of said at least two first protrusions being engageable with a respective one of said casing body protrusions; and
said coupling unit further includes at least two third protrusions disposed on said two second sides of said detachable component and extending outwardly from said second outer peripheral surface portion of said component outer peripheral surface, at least two fourth protrusions each of which extends transversely from a respective one of said at least two third protrusions toward said casing body, and at least two auxiliary grooves disposed on said two second sides of said casing body and formed in said casing body rear peripheral edge surface in proximity to said inner peripheral surface of said casing body for receiving said at least two fourth protrusions, respectively.

15. The protective case assembly as claimed in claim 13, wherein:
said at least one first protrusion includes a single first protrusion that is annular and that extends outwardly from said first outer peripheral surface portion of said component outer peripheral surface;
said at least one second protrusion includes four second protrusions, two of which are disposed on said two first sides of said detachable component and the other two of which are disposed on said two second sides of said detachable component, each of said second protrusions extending outwardly from said second outer peripheral surface portion of said component outer peripheral surface and cooperating with said at least one first protrusion to define therebetween said engaging groove;
said at least one main groove includes a single main groove that is annular and that is formed in said inner peripheral surface of said casing body for receiving said second protrusions;
said coupling unit further includes four third protrusions each two of which are disposed on a corresponding one of said two second sides of said detachable component and extend outwardly from said second outer peripheral surface portion of said component outer peripheral surface, and four auxiliary grooves each two of which are disposed on a corresponding one of said two second sides of said casing body and formed in said inner peripheral surface of said casing body, each of said third protrusions being received in a respective one of said auxiliary grooves;

each of said third protrusions cooperates with said at least one first protrusion to define therebetween an engaging groove; and said at least one casing body protrusion is a single casing body protrusion that is annular and that is engageable with said engaging groove defined by said at least one first protrusion and a corresponding one of said second protrusions and with said engaging groove defined by said at least one first protrusion and a corresponding one of said third protrusions.

16. The protective case assembly as claimed in claim 15, wherein:

each of said second protrusions disposed on a corresponding one of said two second sides of said detachable component is flanked by two of said third protrusions disposed on the same side thereof;

a length of each of said second protrusions extending from said component outer peripheral surface is longer than a length of each of said third protrusions extending from said component outer peripheral surface;

said inner peripheral surface of said casing body has at least two dovetail protrusions formed on each of said two second sides of said casing body; and each of said third protrusions cooperates with one of said second protrusions disposed on one of said two first sides of said detachable component and a corresponding one of said second protrusions disposed on one of said two second sides of said detachable component to define a dovetail groove for receiving a corresponding one of said at least two dovetail protrusions.

17. A coupling unit of a protective case assembly for a handheld device, wherein said coupling unit detachably couples a detachable component of the protective case to a casing body of the protective case, including:

at least one first protrusion extending outwardly from said component outer peripheral surface, wherein said at least one first protrusion is annular; and at least one second protrusion extending outwardly from one of said at least one first protrusion and said component outer peripheral surface, said at least one second protrusion cooperating with said at least one first protrusion to define therebetween an engaging groove for engaging with said at least one casing body protrusion.

* * * * *